United States Patent
Jin

(10) Patent No.: US 11,216,112 B2
(45) Date of Patent: Jan. 4, 2022

(54) DISPLAY PANEL AND DISPLAY APPARATUS

(71) Applicant: Shanghai AVIC OPTO Electronics Co., Ltd, Shanghai (CN)

(72) Inventor: Huijun Jin, Shanghai (CN)

(73) Assignee: SHANGHAI AVIC OPTO ELECTRONICS CO., LTD, Shanghai (CN)

(*) Notice: Subject to any disclaimer, the term of this patent is extended or adjusted under 35 U.S.C. 154(b) by 0 days.

(21) Appl. No.: 17/248,699

(22) Filed: Feb. 3, 2021

(65) Prior Publication Data

US 2021/0157466 A1 May 27, 2021

(30) Foreign Application Priority Data

Nov. 27, 2020 (CN) .......................... 202011359629.7

(51) Int. Cl.
*G06F 3/041* (2006.01)
*G06F 3/044* (2006.01)
*G02F 1/1333* (2006.01)
*H01L 27/32* (2006.01)

(52) U.S. Cl.
CPC ........ *G06F 3/04164* (2019.05); *G06F 3/0412* (2013.01); *G06F 3/0418* (2013.01); *G06F 3/0443* (2019.05); *G06F 3/0446* (2019.05); *G02F 1/13338* (2013.01); *G06F 2203/04111* (2013.01); *H01L 27/323* (2013.01)

(58) Field of Classification Search
CPC .. G06F 3/04164; G06F 3/0446; G06F 3/0443; G06F 3/0412; G06F 3/0418; G06F 2203/04111; G06F 3/0448; G06F 3/04166
See application file for complete search history.

(56) References Cited

U.S. PATENT DOCUMENTS

| | | | | |
|---|---|---|---|---|
| 2014/0168149 A1* | 6/2014 | Han | ...................... | G06F 3/0446 345/174 |
| 2018/0329555 A1* | 11/2018 | Kim | ...................... | G06F 3/0443 |
| 2021/0096680 A1* | 4/2021 | Li | .......................... | G06F 3/0448 |

FOREIGN PATENT DOCUMENTS

| | | |
|---|---|---|
| CN | 204203592 U | 3/2015 |
| CN | 104866161 B | 10/2017 |

* cited by examiner

*Primary Examiner* — Md Saiful A Siddiqui
(74) *Attorney, Agent, or Firm* — Christensen O'Connor Johnson Kindness PLLC

(57) ABSTRACT

Provided are a display panel and a display apparatus. The display panel includes first signal lines, second signal lines, and touch electrodes each including touch sub-electrode groups. Each touch sub-electrode group includes touch sub-electrode rows each including at least two touch sub-electrodes arranged along the first direction. Along a direction perpendicular to the display panel, each touch sub-electrode does not overlap the first signal lines and the second signal lines that are not electrically connected to the touch sub-electrodes. Each touch sub-electrode group further includes intra-group connecting parts each connecting two adjacent touch sub-electrodes. Four closet vertices of four adjacent touch sub-electrodes in the first direction and in the second direction form a smallest quadrilateral having an area of S0, and an orthographic projection of each intra-group connecting part on the plane of the display panel has an area of S1, where S1<S0.

15 Claims, 19 Drawing Sheets

DISPLAY PANEL AND DISPLAY APPARATUS

CROSS-REFERENCE TO RELATED APPLICATION

The present application claims priority to Chinese Patent Application No. 202011359629.7, filed on Nov. 27, 2020, the content of which is incorporated herein by reference in its entirety.

TECHNICAL FIELD

The present disclosure relates to the field of display technologies, and more particularly, to a display panel and a display apparatus.

BACKGROUND

In recent years, with the rapid development of digital information and wireless mobile communication technologies, for the purpose of portability and lightness, many electronic products, such as mobile phones, adopt touch screens as input devices in replacement of traditional keyboards or mice. The emergence of touch screens provides a simple, convenient, and natural way for human-computer interaction.

In order to integrate a touch function in a display panel, it is conventional to add touch electrodes to the display panel. Currently, it has become a research focus to mitigate coupling interference between touch electrodes and electronic components existing in the display panel.

SUMMARY

In this regard, embodiments of the present disclosure provide a display panel and a display apparatus, in order to mitigate coupling interference between touch electrodes and signal lines in the display panel and improve accuracy of display and touch performance of the display panel.

In one aspect, the present disclosure provides a display panel, including: a plurality of first signal lines, wherein each first signal line of the plurality of first signal lines extends along a first direction, wherein the plurality of first signal lines is arranged along a second direction, and wherein the first direction intersecting the second direction; a plurality of second signal lines, wherein each second signal line of the plurality of second signal lines extends along the second direction, and the plurality of second signal lines is arranged along the first direction; and a plurality of touch electrodes. In an embodiment, at least two adjacent touch electrodes of the plurality of touch electrodes are electrically connected to corresponding driving control terminals through different second signal lines of the plurality of second signal lines. In an embodiment, each touch electrode of the plurality of touch electrodes includes a plurality of touch sub-electrode groups arranged in an array along the first direction and the second direction, and a plurality of inter-group connecting parts, wherein each inter-group connecting part of the plurality of inter-group connecting parts connects two adjacent touch sub-electrode groups of the plurality of touch sub-electrode groups along the first direction or the second direction. In an embodiment, each touch sub-electrode group of the plurality of touch sub-electrode groups includes at least two touch sub-electrode rows arranged along the second direction, wherein each of the at least two touch sub-electrode rows comprises at least two touch sub-electrodes arranged along the first direction, wherein each of the at least two touch sub-electrodes comprises a first edge extending along the first direction, and wherein a second edge extending along the second direction. In an embodiment, along a direction perpendicular to a plane of the display panel, wherein each touch sub-electrode does not overlap the plurality of first signal lines, and does not overlap the plurality of second signal lines that are not electrically connected to the at least two touch sub-electrodes. In an embodiment, each touch sub-electrode group of the plurality of touch sub-electrode groups further comprises a plurality of intra-group connecting parts, wherein each intra-group connecting part of the plurality of intra-group connecting parts connecting two touch sub-electrodes adjacent to each other along the first direction or the second direction. In an embodiment, four closest vertices of two adjacent touch sub-electrodes in the first direction and two adjacent touch sub-electrodes in the second direction form a smallest quadrilateral, wherein the smallest quadrilateral has an area of S0; wherein an orthographic projection of each of the plurality of intra-group connecting parts on the plane of the display panel has an area of S1, and wherein the area of S0 and the area of S1 satisfy S1<S0.

In another aspect, the present disclosure provides a display apparatus including the display panel as described above.

In the display panel and the display apparatus according to the embodiments of the present disclosure, each touch sub-electrode avoids the first signal line and the second signal line that is not electrically connected to the touch sub-electrode, such that the parasitic capacitance between the touch sub-electrode and the first signal line, as well as the parasitic capacitance between the touch sub-electrode and the second signal line transmitting a different signal are both reduced. When the signal on the touch sub-electrode changes, through the above arrangement, such a change has reduced influence on signals transmitted on the first signal line and the second signal line, and the accuracy of the signals transmitted on the first signal line and the second signal line can be guaranteed or otherwise improved.

In addition, as the touch sub-electrode avoids the first signal line and the second signal line, in addition to the reduction of the parasitic capacitance between the touch sub-electrode and the first signal line or between the touch sub-electrode and the second signal line, the arrangement of the inter-group connecting part and the intra-group connecting part ensures that the touch electrodes can participate in a touch operation as an electrically connected whole, and will not cause an isolated island-liked touch sub-electrode group or touch sub-electrode in the touch electrode.

According to embodiments of the present disclosure, by setting an area S1 of an orthographic projection of each intra-group connecting part on the plane of the display panel to be smaller than S0, along the direction perpendicular to the plane of the display panel, the intra-group connecting part has a relatively small overlapping area with the first signal line or the second signal line, an area of a part overlapping with the first signal line or the second signal line in the intra-group connecting part can be relatively smaller, or even no part overlapping with both the first signal line and the second signal line exists in the intra-group connecting part. With such an arrangement, the touch sub-electrode is configured to avoid the first signal line or the second signal line, and the touch electrodes are electrically connected as a whole, thereby reducing an overlapping area between the touch electrode where the intra-group connecting part is located and the first signal line or the second signal line, and further reducing coupling influence of signals transmitted on the first signal line, the second signal line and the touch electrode. In this way, the accuracy of the signals transmitted on the first signal line, the second signal line, and the touch electrode are guaranteed or otherwise improved.

BRIEF DESCRIPTION OF DRAWINGS

In order to clearly illustrate technical solutions of the embodiments of the present disclosure, drawings used in embodiments are briefly described below. The drawings in the following descriptions merely illustrate part embodiments of the present disclosure, and for those skilled in the art, other drawings can be obtained according to these drawings without creative effort.

DESCRIPTION OF EMBODIMENTS

In order to better understand technical solutions of the present disclosure, the embodiments of the present disclosure will be described in detail below with reference to the accompanying drawings.

It will be understood that the described embodiments are only a part of, rather than all of, the embodiments of the present disclosure. Based on embodiments of the present disclosure, all other embodiments obtained by those skilled in the art without creative effort shall fall within the scope of the present disclosure.

Terms used in embodiments of the present disclosure are only for a purpose of describing specific embodiments, and are not intended to limit the present disclosure. Singular forms of "a", "said" and "the" used in embodiments of the present disclosure and the attached claims are also intended to include plural forms, unless the context clearly indicates other meanings.

It will be understood that the term "and/or" used herein is only an association relationship describing associated objects, indicating three possible relationships. For example, A and/or B may mean that only A exists, both A and B exist, and only B exists. In addition, the character "/" herein generally indicates that associated objects before and after the character " " are in an "or" relationship.

It will be understood that, the terms such as first, second, etc., may be used in embodiments of the present disclosure to describe intra-group connecting parts, but are not intended to limit the intra-group connecting parts. These terms are merely used to distinguish different intra-group connecting parts from each other. For example, without departing from the scope of embodiments of the present disclosure, a first intra-group connecting part may also be referred to as a second intra-group connecting part, and similarly, the second intra-group connecting part may also be referred to as the first intra-group connecting part.

Figure 1:
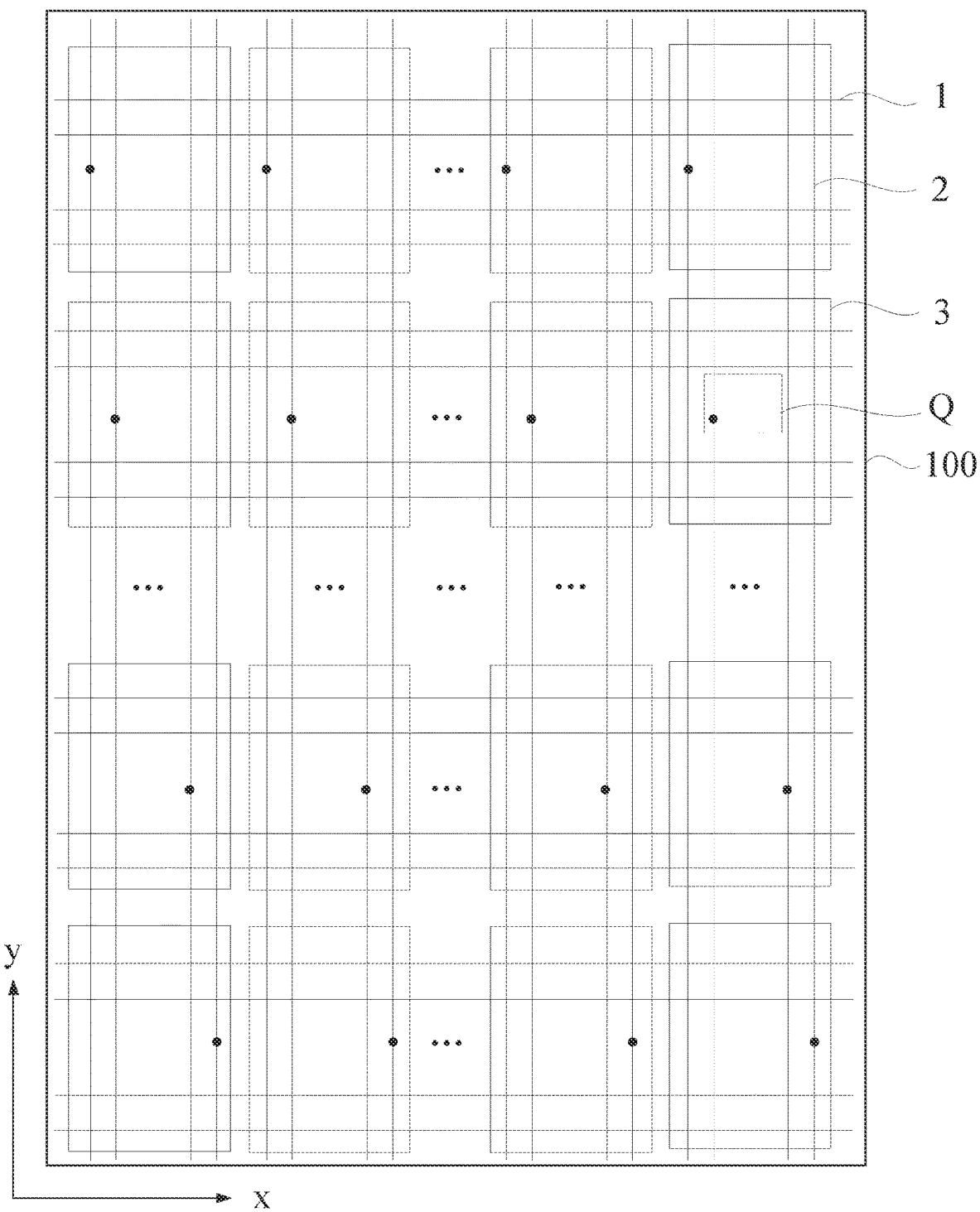
FIG. 1 is a schematic top view of a display panel, according to an embodiment of the present disclosure.
Figure 2:
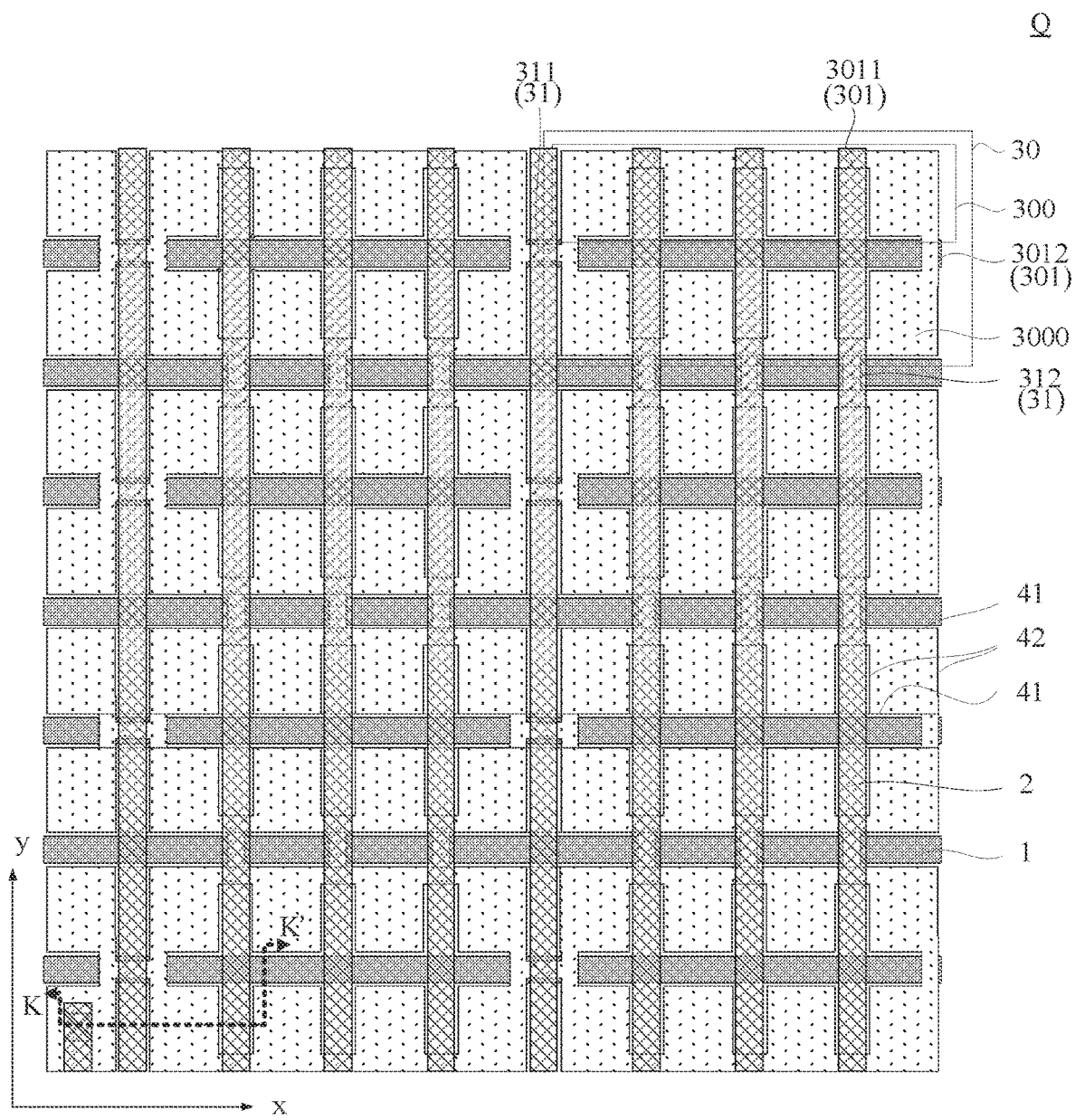
FIG. 2 is an enlarged schematic diagram of a region Q in FIG. 1, according to an embodiment of the present disclosure.

An embodiment of the present disclosure provides a display panel, as illustrated in FIGS. 1 and 2. FIG. 1 is a schematic top view of a display panel according to an embodiment of the present disclosure, and FIG. 2 is an enlarged schematic diagram of a region Q in FIG. 1. The display panel includes a plurality of pixel units (not shown), a plurality of first signal lines 1, a plurality of second signal lines 2, and a plurality of touch electrodes 3.

Each of the pixel units may include a plurality of sub-pixels of different colors. In some embodiments, the display panel according to the present disclosure may be a liquid crystal display panel, or the display panel according to the present disclosure may be a self-luminous display panel adopting self-luminous technology, such as an organic light-emitting display panel or a quantum dot light-emitting display panel. When the display panel is configured to be the liquid crystal display panel, the above-mentioned sub-pixels include color filter structures with different light-emitting colors on a color filter substrate, and pixel electrodes and common electrodes for controlling deflection of liquid crystals between the color filter substrate and an array substrate. The touch electrodes 3 may be arranged on a side of the color filter substrate away from the array substrate. When the display panel is configured to be the organic light-emitting display panel, the above-mentioned sub-pixels include organic light-emitting devices of different colors, and a pixel driving circuit for controlling the organic light-emitting devices to emit light. The touch electrodes may be arranged on a light-emitting side of the organic light-emitting devices.

As illustrated in FIGS. 1 and 2, each first signal line 1 extends along a first direction x, and the plurality of first signal lines 1 is arranged along a second direction y. The first direction x intersects the second direction y. Each second signal line 2 extends along the second direction y, and the plurality of second signal lines 2 is arranged along the first direction x. That is, an orthographic projection of the first signal line 1 on a plane where the display panel intersects an orthographic projection of the second signal line 2.

Figure 3:
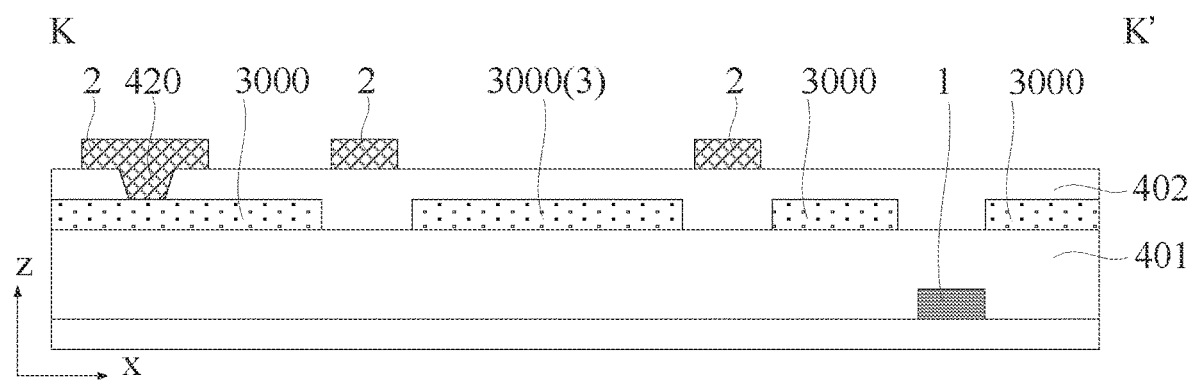
FIG. 3 is a schematic cross-sectional view taken along line KK' in FIG. 2, according to an embodiment of the present disclosure.

In the present embodiment of the present disclosure, the first signal line 1, the second signal line 2, and the touch electrode 3 may be formed by different conductive film layers, and every two adjacent conductive film layers are separated from each other by an insulation layer. FIG. 3 is a schematic cross-sectional view taken along line KK' in FIG. 2. As illustrated in FIG. 3, according to the present embodiment of the present disclosure, along a direction perpendicular to a plane of the display panel, the touch electrode 3 is located between the first signal line 1 and the second signal line 2, a first insulation layer 401 is arranged between the first signal line 1 and the touch electrode 3, and a second insulation layer 402 is arranged between the touch electrode 3 and the second signal line 2. For the purpose of clearly illustrating the embodiment of the present disclosure, structures other than the first signal line 1, the second signal line 2, and the touch electrode 3 in the display panel are omitted in FIGS. 2 and 3.

As an example, the above-mentioned first signal line 1 may be a scan line electrically connected to the sub-pixels.

The second signal line 2 may be a touch signal line electrically connected to the touch electrode 3. In the present embodiment of the present disclosure, at least two adjacent touch electrodes 3 are electrically connected to corresponding driving control terminals on a touch chip (not shown) through different second signal lines 2. When a finger touches the display panel, a capacitance generated between the finger and the touch electrode can be superimposed on a ground capacitance of the touch electrode 3, causing a change in the ground capacitance of the touch electrode 3. The change in the ground capacitance may be transmitted to the touch chip through the second signal line 2. In this way, the touch chip can determine a touch position based on the change in the capacitance before and after the touch. In the present embodiment of the present disclosure, as illustrated in FIG. 1, one second signal line 2 is electrically connected to one touch electrode 3. In another embodiment, multiple second signal lines 2 are provided to be electrically connected to the same one touch electrode 3. Regarding this aspect, the embodiments of the present disclosure are not specifically limited. As illustrated in FIG. 3, the second signal line 2 and the touch electrode 3 that are electrically connected to each other are located in different conductive film layers, and the second signal line 2 and the touch electrode 3 are electrically connected through a via-hole 420 provided in the second insulation layer 402, which is located between the second signal line 2 and the touch electrode 3.

Figure 4:
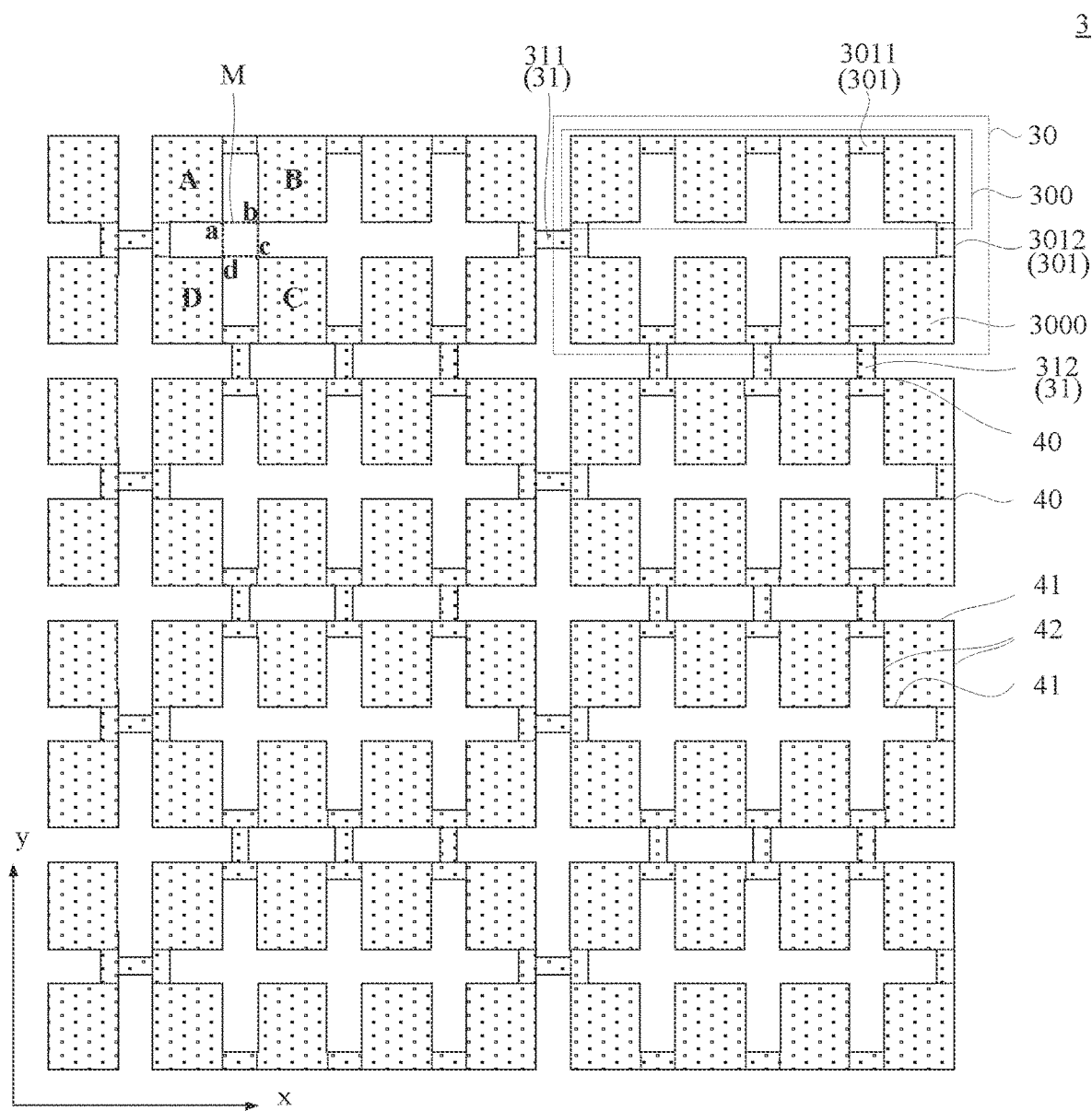
FIG. 4 is an enlarged schematic diagram of a touch electrode in the region Q in FIG. 1, according to an embodiment of the present disclosure.

FIG. 4 is an enlarged schematic diagram of a touch electrode in the region Q in FIG. 1. Referring to FIG. 2 and FIG. 4, the touch electrode 3 includes a plurality of touch sub-electrode groups 30 and a plurality of inter-group connecting parts 31. The touch sub-electrode groups 30 are arranged along the first direction x and the second direction y, and arranged in an array. Each inter-group connecting part 31 connect two touch sub-electrode groups 30 that are adjacent to each other along the first direction x or the second direction y.

As an example, one touch sub-electrode group 30 includes at least two touch sub-electrode rows 300 arranged along the second direction y. Each touch sub-electrode row 300 includes at least two touch sub-electrodes 3000 arranged along the first direction x. In FIG. 2 and FIG. 4, for example, each touch sub-electrode group 30 includes two touch sub-electrode rows 300, and each touch sub-electrode row 300 includes four touch sub-electrodes 3000.

In the embodiment of the present disclosure, as illustrated in FIG. 2 and FIG. 3, along a direction z perpendicular to the plane of the display panel, the touch sub-electrode 3000 does not overlap the first signal line 1, and the touch sub-electrode 3000 does not overlap the second signal line 2. It should be noted that the second signal line 2 not overlapping the touch sub-electrode 3000 refers to the second signal line 2 that is not electrically connected to the touch electrode 3 to which the touch sub-electrode 3000 belongs. The second signal line 2 electrically connected to the touch electrode 3 may overlap touch sub-electrodes 3000 in the touch electrode 3. In an embodiment of the present disclosure, one or more touch sub-electrodes 3000 of the touch electrode 3 may be in contact with and connected to the second signal line 2 through the via-hole. FIG. 2 and FIG. 3 schematically illustrate that one touch sub-electrode 3000 of the touch electrode 3 is in contact with and connected to the second signal line 2 through the via-hole 420 in the second insulation layer 402. When a touch operation is performed on the display panel, the second signal line 2 and the touch electrode 3 that are electrically connected to each other transmit the same signal.

As mentioned above, a determination of the touch position is closely related to the signal on the touch electrode 3. Therefore, compared with the solution in which the touch sub-electrode 3000 is arranged to overlap the first signal line 1 or the second signal line 2 along the direction z perpendicular to the plane of the display panel, in the embodiment of the present disclosure, since the touch sub-electrode 3000 is arranged to avoid the first signal line 1 and the second signal line 2 that is not electrically connected to the touch sub-electrode 3000, a parasitic capacitance between the touch sub-electrode 3000 and the first signal line 1 can be reduced, as well as a parasitic capacitance between the touch sub-electrode 3000 and the second signal line 2 that transmits a different signal can be reduced. When the signal on the touch sub-electrode 3000 changes, through the above arrangement, such a change has reduced influence on signals transmitted on the first signal line 1 and the second signal line 2, and the accuracy of the signals transmitted on the first signal line 1 and the second signal line 2 may be guaranteed.

For example, in a case that the first signal line 1 is a scan line that transmits a scan signal to the sub-pixels, on the basis of the arrangement according to the embodiment of the present disclosure, the accuracy of the scan signal on the first signal line 1 can be guaranteed even if the signal on the touch sub-electrode 3000 changes, the charging of the sub-pixels connected to the first signal line 1 is not affected, and the display effect of the display panel is guaranteed. Similarly, when the signal on the first signal line 1 or the second signal line 2 changes, with the arrangement according to the embodiment of the present disclosure, the influence of the touch signal on the touch sub-electrode 3000 arranged close to the first signal line 1 or the second signal line 2 may also be mitigated, thereby ensuring that the touch performance of the display panel is not affected.

As an example, according to the embodiments of the present disclosure, a shape of the touch sub-electrode 3000 may be designed based on arrangements of the first signal line 1 and the second signal line 2. With reference to FIG. 2 and FIG. 4, in the embodiment of the present disclosure, edges of the touch sub-electrode 3000 include a first edge 41 and a second edge 42 with different extension directions, and the first edge 41 close to the first signal line 1 extends along the first direction x, and the second edge 42 close to the second signal line 2 extends along the second direction y. That is, an extension direction of the first edge 41 is parallel to the first signal line 1, and an extension direction of the second edge 42 is parallel to the second signal line 2. With such an arrangement, the touch sub-electrode 3000 is ensured to not overlap the first signal line 1 and the second signal line 2 along the direction z perpendicular to the plane of the display panel, while the touch sub-electrode 3000 has a larger area, so as to reduce an area of a region not covered by the touch electrode 3000 in the display panel, and to avoid blind spots of touch in the display panel.

It should be noted that, in FIG. 2 and FIG. 4, both the shape and area of the touch sub-electrode 3000 are illustrative. In actual design, the shape and/or area of the touch sub-electrode 3000 may be adjusted based on the arrangement of the first signal line 1 and the second signal line 2 and a shape of the display panel. For example, when the touch sub-electrode 3000 is applied to a display panel with a fillet including an arc-shaped edge, an edge of the touch sub-electrode 3000 adjacent to the fillet of the display panel may also be set to be an arc. That is, the touch sub-electrode 3000 at the position of the fillet may further include an arc edge connected to the first edge 41 and the second edge 42, such that the touch sub-electrode 3000 at the position of the fillet has a fan-like shape.

In addition, it should be understood that, in addition to absolute parallel in the geometric sense, regarding the extension direction of the first edge 41 being parallel to the first signal line 1 and the extension direction of the second edge 42 being parallel to the second signal line 2, deviations within an allowable range of fabrication errors are also included in the scope of embodiments of the present disclosure.

Further referring to FIG. 2 and FIG. 4, as the touch sub-electrode 3000 is arranged to avoid the first signal line 1 and the second signal line 2, i.e., the touch sub-electrode 3000 overlaps neither with the first signal line 1 nor with the second signal line 2 along the direction z perpendicular to the plane of the display panel, multiple intra-group connecting parts 301 can be arranged in the touch sub-electrode group 30, and each of the intra-group connecting parts 301 is used to connect two touch sub-electrodes 3000 that are adjacent to each other along the first direction x or along the second direction y.

As an example, in the embodiment of the present disclosure, an orthographic projection of the intra-group connecting part 301 on the plane of the display panel and an orthographic projection of the inter-group connecting part 31 on the plane of the display panel each have a smaller area than the touch sub-electrode 3000. When the second signal line 2 and the touch electrode 3 are connected, one or more touch sub-electrodes 3000 in the touch electrode 3 can be in contact with and connected to the second signal line 2 through the via-hole. For example, a part of the touch sub-electrodes 3000 in the touch sub-electrode group 30 may be in contact with and connected to the second signal line 2 through the via-hole. The touch sub-electrodes 3000 in the other touch sub-electrode groups 30 are not in contact with the second signal line 2 through the via-hole.

When the touch operation is performed on the display panel, a driving signal sent by the touch chip may be transmitted to other touch sub-electrode groups 30 that are not connected to the second signal line 2 through the via-hole after sequentially passing through the second signal line 2, the touch sub-electrode group 30 connected to the second signal line 2 through the via-hole, and the inter-group connecting part 31. For the touch sub-electrode groups 30 that are not connected to the second signal line 2 through the via-hole, signals sensed by these touch sub-electrode groups 30 during the touch process can also be transmitted, through the inter-group connecting parts 31, to the touch sub-electrode group 30 connected to the second signal line 2 through the via-hole, and then transmitted to the touch chip via the second signal line 2. In addition, in any one touch sub-electrode group 30, any touch sub-electrode 3000 in the touch sub-electrode group 30 can transmit a signal to other touch sub-electrodes 3000 in the same touch sub-electrode group 30 through the intra-group connecting part 301.

In this regard, as the touch sub-electrode 3000 is arranged to avoid the first signal line 1 and the second signal line 2, the parasitic capacitance between the touch sub-electrode 3000 and the first signal line 1 or the second signal line 2 can be reduced, the arrangement of the inter-group connecting part 31 and the intra-group connecting part 301 ensures that the touch electrodes 3 can still participate in the touch operation as an electrically connected whole, preventing a presence of an isolated island-liked touch sub-electrode group 30 or touch sub-electrode 3000 in the touch electrode 3.

In the present embodiment of the present disclosure, the four touch sub-electrodes 3000 adjacent to each other and arranged in two rows and two columns have four vertices at a closest distance to each other, and a smallest quadrilateral defined by the four vertices has an area of S0. In FIG. 4, the four touch sub-electrodes 3000 that are adjacent to each other and arranged in two rows and two columns are respectively denoted with labels A, B, C, and D. The four vertices at the closest distance to each other of the four touch sub-electrodes that are adjacent to each other are respectively: a vertex a of a touch sub-electrode A, a vertex b of a touch sub-electrode B, a vertex c of a touch sub-electrode C, and a vertex d of a touch sub-electrode D. In FIG. 4, the smallest quadrilateral defined by the four vertices is illustrated as a quadrilateral M, which is outlined with dashed line. The quadrilateral M has the area of S0. As shown in FIG. 2, along the direction perpendicular to the plane of the display panel, a region where the quadrilateral M is located overlaps with both the first signal line 1 and the second signal line 2.

In the present embodiment of the present disclosure, an orthographic projection of the intra-group connecting part 301 on the plane of the display panel has an area of S1, satisfying S1<S0.

In the display panel according to the present embodiment of the present disclosure, by setting the area S1 of the orthographic projection of the intra-group connecting part 301 on the plane of the display panel to be smaller than S0, along the direction z perpendicular to the plane of the display panel, the intra-group connecting part 301 overlaps the first signal line 1 or the second signal line 2 in a relatively small area, a portion of the intra-group connecting part 301 overlapping with the first signal line 1 or the second signal line 2 can be made relatively small, even no portion of the intra-group connecting part 301 overlapping with the first signal line 1 and the second signal line 2. With such an arrangement, the touch sub-electrode 3000 can be ensured to avoid the first signal line 1 or the second signal line 2, and the touch electrodes 3 can be electrically connected as a whole, while the touch electrode 3 where the intra-group connecting part 301 is located overlaps the first signal line 1 or the second signal line 2 in a reduced areas, thereby reducing the coupling influence of signals transmitted on the first signal line 1, the second signal line 2, and the touch electrode 3. Therefore, the accuracy of the signals transmitted on the first signal line 1, the second signal line 2, and the touch electrode 3 can be guaranteed.

As an example, as illustrated in FIG. 2 and FIG. 4, as the touch sub-electrode group 30 includes at least two touch sub-electrode rows 300 and each touch sub-electrode row 300 includes at least two touch sub-electrodes 3000, in this embodiment of the present disclosure, the intra-group connecting part 301 can be configured to include a first intra-group connecting part 3011 and a second intra-group connecting part 3012. The first intra-group connecting part 3011 connects two touch sub-electrodes 3000 that are adjacent to each other along the first direction x in one touch sub-electrode row 300. The second intra-group connecting part 3012 connects two touch sub-electrode rows 300 that are adjacent to each other along the second direction y. For example, the second intra-group connecting part 3012 may connect two touch sub-electrodes 3000 belonging to the two touch sub-electrode rows 300. In another embodiment, the second intra-group connecting part 3012 may also connect to two first intra-group connecting parts 3011 belonging to the two touch sub-electrode rows 300.

When the touch electrode 3 includes a plurality of touch sub-electrode groups 30, according to an embodiment of the present disclosure, the inter-group connecting part 31 can be configured to include a first inter-group connecting part 311 and a second inter-group connecting part 312. The first inter-group connecting part 311 connects two touch sub-electrode groups 30 adjacent to each other along the first direction x. The second inter-group connecting part 312 connects two touch sub-electrode groups 30 adjacent to each other along the second direction y.

As an example, in the present embodiment of the present disclosure, the touch sub-electrodes 3000 at different positions may be formed by patterning the same film layer. Connecting parts including the first intra-group connecting part 3011, the second intra-group connecting part 3012, the first inter-group connecting part 311, and the second inter-group connecting part 312 may be formed of the same material as the touch sub-electrodes 3000, and the connecting parts may be arranged in the same layer as the touch sub-electrodes 3000. For example, the touch sub-electrode 3000, the first intra-group connecting part 3011, the second intra-group connecting part 3012, the first inter-group connecting part 311, and the second inter-group connecting part 312 may all be made of transparent conductive oxide, and, for example, made of any one or more of indium tin oxide (ITO), indium zinc oxide (IZO), and indium gallium zinc oxide (IGZO).

As illustrated in FIG. 4, when the first intra-group connecting part 3011, the second intra-group connecting part 3012, the first inter-group connecting part 311, and the second inter-group connecting part 312 are made in the same layer as the touch sub-electrode 3000, a conductive film layer with a whole layer structure can be first formed on a substrate through a film forming process, in which the whole layer structure refers to a complete film layer structure that may cover the substrate; then through a patterning process, such as exposure, etching, and development steps, the film at some positions is removed, such that the touch sub-electrodes 3000, the first intra-group connecting part 3011, the second intra-group connecting part 3012, the first inter-group connecting part 311, and the second inter-group connecting part 312 are correspondingly formed at the positions where the film are retained.

With such a process, on the one hand, an addition of the insulation layer in the touch electrode 3 can be avoided, the manufacturing process of the touch electrode 3 can be simplified, and a total film thickness of the touch electrode 3 can be reduced; and on the other hand, the first intra-group connecting part 3011, the second intra-group connecting part 3012, the first inter-group connecting part 311, the second inter-group connecting part 312, and the touch sub-electrode 3000 may be fabricated in the same patterning process, which avoids a problem of open circuit or poor conductivity that may occur due to fabrication errors generated during separate production.

In other embodiments, the connecting parts including the first intra-group connecting part 3011, the second intra-group connecting part 3012, the first inter-group connecting part 311, and the second inter-group connecting part 312, may be made of a material different from the touch sub-electrode 3000. The above-mentioned connecting parts and the touch sub-electrode 3000 can be arranged in different layers. For example, when the touch sub-electrode 3000 is made of a transparent conductive oxide, a metal material with a smaller resistivity can be selected to form the first intra-group connecting part 3011, the second intra-group connecting part 3012, the first inter-group connecting part 311, and the second inter-group connecting part 312, so as to improve the conductivity of the touch electrode 3 and to improve touch sensitivity of the display panel.

Figure 5:
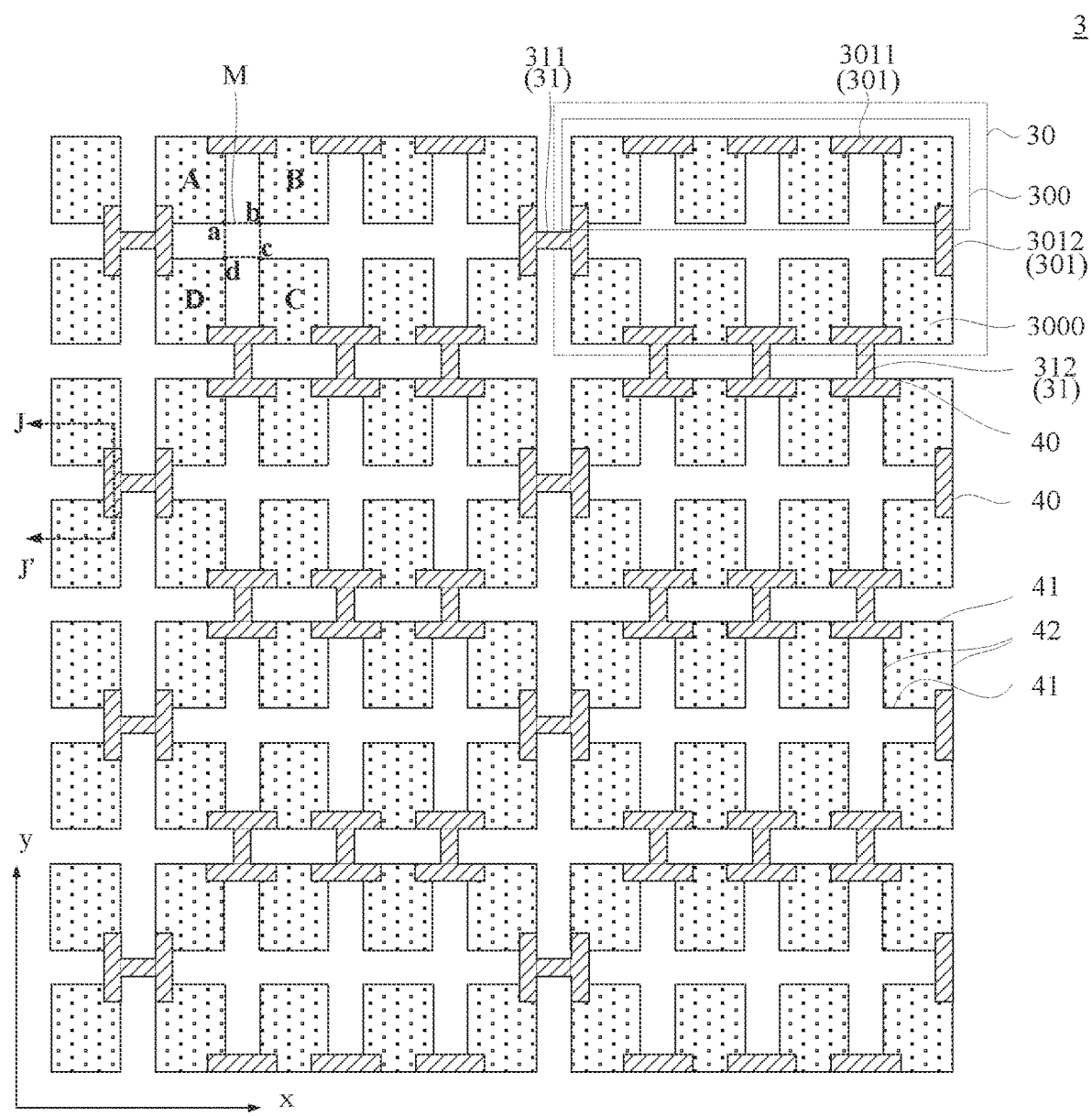
FIG. 5 is an enlarged schematic diagram of a touch electrode in the region Q in FIG. 1, according to an embodiment of the present disclosure.
Figure 6:
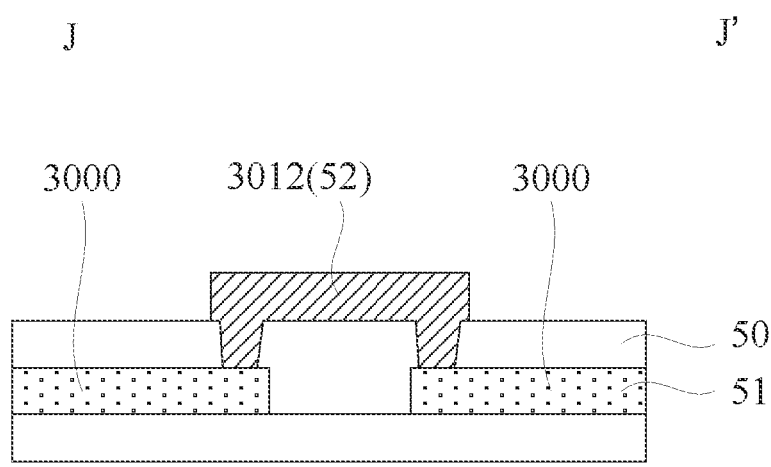
FIG. 6 is a cross-sectional view taken along line JJ' in FIG. 5, according to an embodiment of the present disclosure.

FIG. 5 is an enlarged schematic diagram of a touch electrode in the region Q in FIG. 1, and FIG. 6 is a cross-sectional view taken along line JJ' in FIG. 5. As illustrated in FIG. 5 and FIG. 6, the first intra-group connecting part 3011, the second intra-group connecting part 3012, the first inter-group connecting part 311, and the second inter-group connecting part 312 are formed in a different film layer from the touch sub-electrode 3000. As an example, when the film layer where the touch sub-electrode 3000 is located is first formed, the first conductive film layer 51 of the whole layer structure is formed on the substrate through the film forming process, and then, through the patterning process, the film layer at some positions is removed through, for example, exposure, etching and development steps, so as to correspondingly form the touch sub-electrodes 3000 at the positions where the film layer are retained. Then, a third insulation layer 50 is formed on the touch sub-electrode 3000. The third insulation layer 50 is etched to form the via-hole, and a second conductive film layer 52 of the whole layer structure is formed on the third insulation layer 50. The second conductive film layer 52 can fill the via-hole formed in the above-mentioned third insulation layer 50. After the second conductive film layer 52 is formed, the material at some positions is removed through a patterning process, such that the first intra-group connecting part 3011, the second intra-group connecting part 3012, the first inter-group connecting part 311, and the second inter-group connecting part 312 are correspondingly formed at the positions where the material is retained. The first intra-group connecting part 3011 and the second intra-group connecting part 3012 are in contact with and connected to the touch sub-electrode 3000 through the above-mentioned via-holes formed in the third insulation layer 50.

In other embodiments of the present disclosure, the above-mentioned connecting parts including the first inter-group connecting part 311 and the second inter-group connecting part 312 may be a stacked structure formed by stacking the transparent conductive oxide and the metal.

It should be noted that, when the first intra-group connecting part 3011, the second intra-group connecting part 3012, the first inter-group connecting part 311, and the second inter-group connecting part 312 are fabricated on the same layer, if the first intra-group connecting part 3011 is connected to the second inter-group connecting part 312, the boundary lines between the first intra-group connecting part 3011 and the second inter-group connecting part 312 in FIG. 4 and FIG. 5 are merely schematic for clearly illustrating the first intra-group connecting part 3011 and the second inter-group connecting part 312. In the actual film layer structure, the first intra-group connecting part 3011 and the second inter-group connecting part 312 are formed into one piece without boundary line. Similarly, when the second intra-group connecting part 3012 is connected to the first inter-group connecting part 311, the boundary lines between the second intra-group connecting part 3012 and the first inter-group connecting part 311 in FIG. 4 and FIG. 5 are also merely illustrative and does not exist in the actual film layer structure. Similarly, when the touch sub-electrode 3000 is fabricated in the same layer as the first intra-group connecting part 3011 and the second intra-group connecting part 3012, the boundary lines between the touch sub-electrode 3000 and the first intra-group connecting part 3011 and between the touch sub-electrode 3000 and the second intra-group connecting part 3012 are also for illustration.

As an example, according to an embodiment of the present disclosure, at least one of the first intra-group connecting part 3011 and the second intra-group connecting part 3012 is connected to a point where the first edge 41 and the second edge 42 of the touch sub-electrode 3000 intersect. As illustrated in FIG. 4 and FIG. 5, the touch sub-electrode 3000 is provided in a quadrilateral shape having two first edges 41 and two second edges 42. A point where the first edge 41 and the second edge 42 intersect is shown as a point 40. In the present embodiment of the present disclosure, the touch sub-electrode 3000 having the quadrilateral shape includes four points 40. As illustrated in FIG. 4 and FIG. 5, in the present embodiment of the present disclosure, the first intra-group connecting part 3011 and the second intra-group connecting part 3012 are respectively connected to different points 40 in the touch sub-electrode 3000.

When the first intra-group connecting part 3011 and the second intra-group connecting part 3012 are both set to be connected to the points 40 of the touch sub-electrode 3000, along the direction perpendicular to the plane of the display panel, the first intra-group connecting part 3011 is set to only overlap the second signal line 2, but not overlap the first signal line 1; and/or, the second intra-group connecting part 3012 may is set to only overlap the first signal line 1, but not overlap the second signal line 2. As shown in FIG. 4 and FIG. 5, the first intra-group connecting part 3011 only overlaps the second signal line 2 and the second intra-group connecting part 3012 only overlaps the first signal line 1.

When both the first intra-group connecting part 3011 and the second intra-group connecting part 3012 are arranged to be connected to the points 40 of the touch sub-electrode 3000, and two touch sub-electrode rows 300 are provided in one touch sub-electrode group 30, as illustrated in FIG. 4 and FIG. 5, the first intra-group connecting part 3011 and the second intra-group connecting part 3012 are arranged along the outermost edges of the touch sub-electrode group 30. With such an arrangement, on the one hand, a hollow region having a relatively large area, i.e., a region in the touch electrode 3 where none of the touch sub-electrodes and the connecting parts is provided, can be formed inside the touch sub-electrode group 30, thereby reducing the overlapping area between the touch electrode 3 and the first signal line 1 or between the touch electrode 3 and the second signal line 2. On the other hand, it is also possible to ensure the shortest distance between two first intra-group connecting parts 3011 that are adjacent to each other and belong to two touch sub-electrode groups 30, and also to ensure the shortest distance between two second intra-group connecting parts 3012 that are adjacent to each other and belong to two touch sub-electrode groups 30. In this way, by providing the inter-group connecting parts 31 configured to connect two adjacent touch sub-electrode groups 30, the first inter-group connecting part 311 can be configured to connect two adjacent second intra-group connecting parts 3012, and these two second intra-group connecting parts 3012 connected to the first inter-group connecting part 311 belong to two touch sub-electrode groups 30, respectively; and/or, the second inter-group connecting part 312 can be configured to connect two adjacent first intra-group connecting parts 3011, and these two first intra-group connecting parts 3011 connected to the second inter-group connecting part 312 belong to two touch sub-electrode groups 30, respectively.

In the embodiment shown in FIG. 4 and FIG. 5, the first inter-group connecting part 311, which connects the two touch sub-electrode groups 30 adjacent to each other along the first direction x, has a relatively short length, and the second inter-group connecting part 312, which connects the two touch sub-electrode groups 30 adjacent to each other along the second direction y, has a relatively short length. Therefore, such an arrangement can further reduce the overlapping area between the touch electrode 3 and the first signal line 1 and/or between the touch electrode 3 and the second signal line 2.

As an example, in the embodiment shown in FIG. 4 and FIG. 5, both the first inter-group connecting part 311 and the second inter-group connecting part 312 are provided; and the first inter-group connecting part 311 is configured to connect the two adjacent second intra-group connecting parts 3012, and/or the second inter-group connecting part 312 is configured to connect the two adjacent first intra-group connecting parts 3011, the first inter-group connecting part 311 has the same shape and area as the first intra-group connecting part 3011, and the second inter-group connecting part 312 has the same shape and area as the second intra-group connecting part 3012. At a position where the first inter-group connecting part 311 is located, the two second intra-group connecting parts 3012 and the first inter-group connecting part 311 located between the two second intra-group connecting parts 3012 together form a shape similar to "H". At a position where the second inter-group connecting part 312 is located, the second inter-group connecting part 312 and two first intra-group connecting parts 3011 located on both sides of the second inter-group connecting part 312 together form a "I"-like shape.

Figure 7:
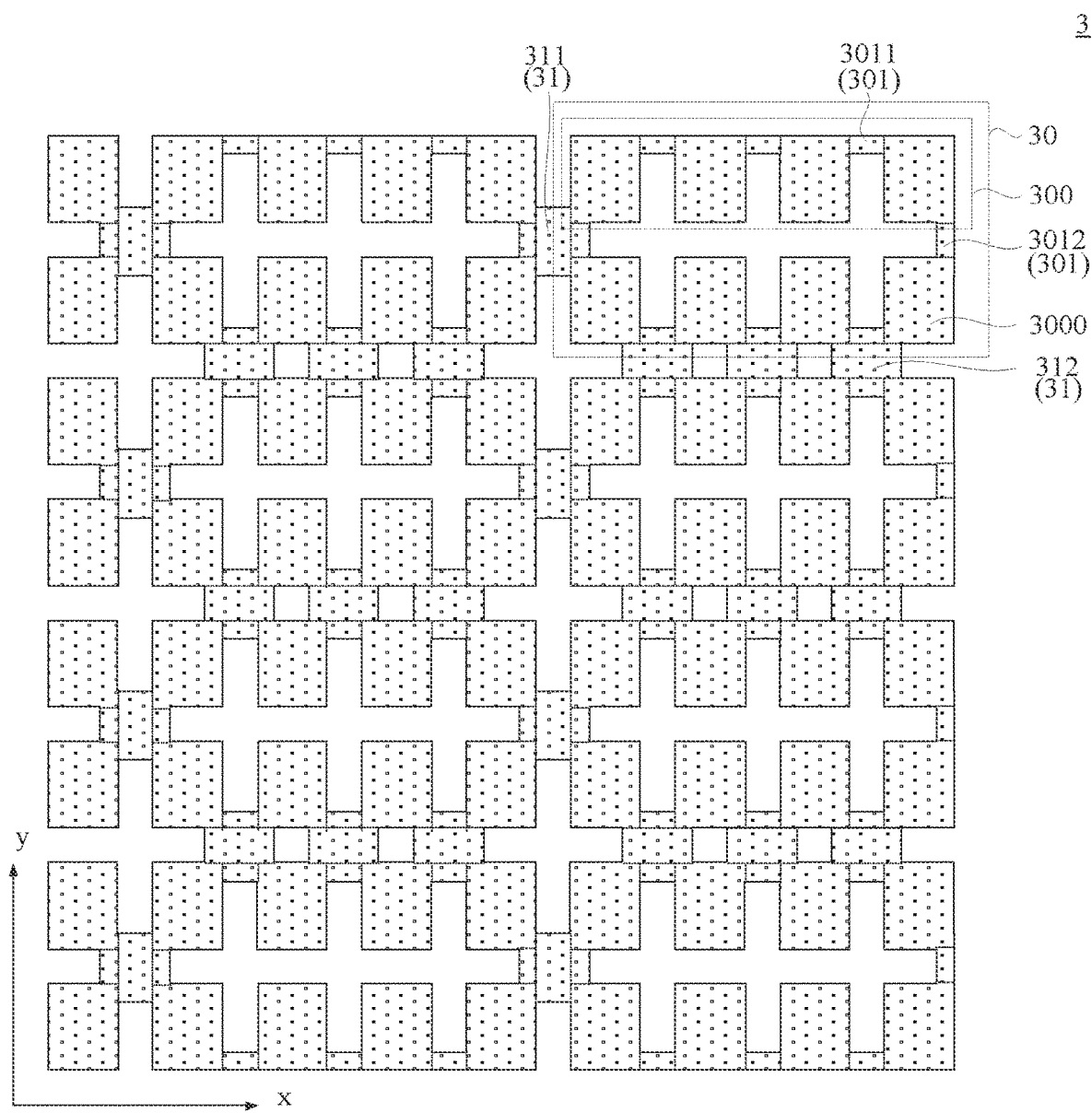
FIG. 7 is an enlarged schematic diagram of a touch electrode in the region Q in FIG. 1, according to an embodiment of the present disclosure.
Figure 8:
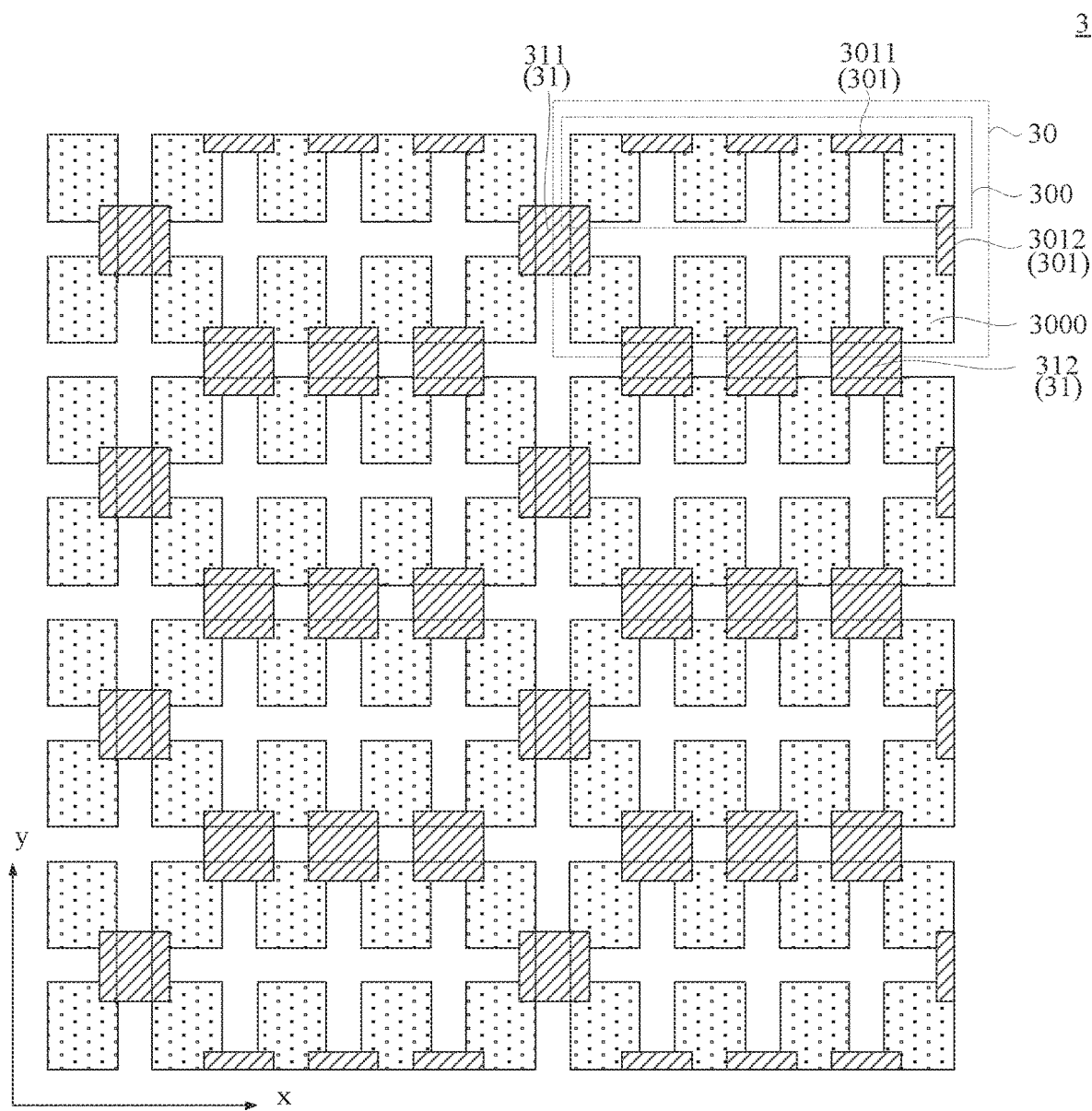
FIG. 8 is an enlarged schematic diagram of a touch electrode in the region Q in FIG. 1, according to an embodiment of the present disclosure.

In some embodiments, on the basis of FIG. 4 and FIG. 5, at least a part of the first inter-group connecting parts 311 and/or the second inter-group connecting parts 312 can have an increased area, as illustrated in FIG. 7 and FIG. 8. FIG. 7 and FIG. 8 are two enlarged schematic diagrams of the touch electrode in the region Q in FIG. 1. FIG. 7 differs from FIG. 4 in that the first inter-group connecting part 311 shown in FIG. 7 has a greater length along the second direction y than the first inter-group connecting part 311 shown in FIG. 4, and the second inter-group connecting part 312 illustrated in FIG. 7 has a greater length along the first direction x than the second inter-group connecting part 312 illustrated in FIG. 4. FIG. 8 differs from FIG. 5 in that the first inter-group connecting part 311 illustrated in FIG. 8 has a greater length along the second direction y than the first inter-group connecting part 311 illustrated in FIG. 5, and the second inter-group connecting part 312 illustrated in FIG. 8 has a greater length along the first direction x than the second inter-group connecting part 312 illustrated in FIG. 5. When the connecting parts and the touch sub-electrodes 3000 are arranged in different layers, as illustrated in FIG. 8, the first inter-group connecting part 311 and the two second intra-group connecting parts 3012 located on both sides of the first inter-group connecting part 311 can be formed to have a quadrangular structure, and the second inter-group connecting part 312 and the two first intra-group connecting parts 3011 on both sides of the second inter-group connecting part 312 can be formed to have a quadrangular structure.

With the arrangement illustrated in FIG. 7 or FIG. 8, on the one hand, by increasing the area of the first inter-group connecting part 311 and/or the area of the second inter-group connecting part 312, resistance during the transmission of the touch signal may be reduced; and on the other hand, by increasing the area of the first inter-group connecting part 311 or the second inter-group connecting part 312 located between four touch sub-electrodes 3000 adjacent to each other, the reliability of connection of the four touch sub-electrodes 3000 adjacent to each other may also be increased, and an open circuit is less likely to occur due to a breakage of the first inter-group connecting part 311 or the second inter-group connecting part 312.

In some embodiments of the present disclosure, the touch sub-electrode group 30 may be divided in many different manners. As an example, E touch sub-electrode rows 300 are provided in the touch sub-electrode group 30, and F touch sub-electrodes 3000 are provided in each of the E touch sub-electrode rows 300, where E and F are both positive integers, E≥2, and F≥2. At least one second intra-group connecting part 3012 is arranged between two touch sub-electrode rows 300 adjacent to each other. That is, in one touch sub-electrode group 30, a number of the second intra-group connecting parts 3012 is at least (E−1). In one touch sub-electrode row 300, at least one first intra-group connecting part 3011 is arranged between two touch sub-electrodes 3000 adjacent to each other along the first direction x. That is, each touch sub-electrode row 300 is provided with at least (F−1) first intra-group connecting parts 3011. Therefore, in one touch sub-electrode group 30, a number of the first intra-group connecting part 3011 is at least E*(F−1). In the embodiment shown in FIG. 4 and FIG. 5, E=2, F=4, and thus six first intra-group connecting parts 3011 and two second intra-group connecting parts 3012 are arranged in one touch sub-electrode group 30.

In the region where the touch electrode 3 is located, E is 2, and F can be a positive value smaller than or equal to 3 according to an embodiment of the present disclosure, so as to uniformly distribute the touch sub-electrodes 3000 and the connecting parts including the first inter-group connecting part 311, the second inter-group connecting part 312, the first intra-group connecting part 3011 and the second intra-group connecting part 3012, thereby improving the uniformity of touch at different positions and the visibility of a pattern of the touch electrode, t.

Figure 9:
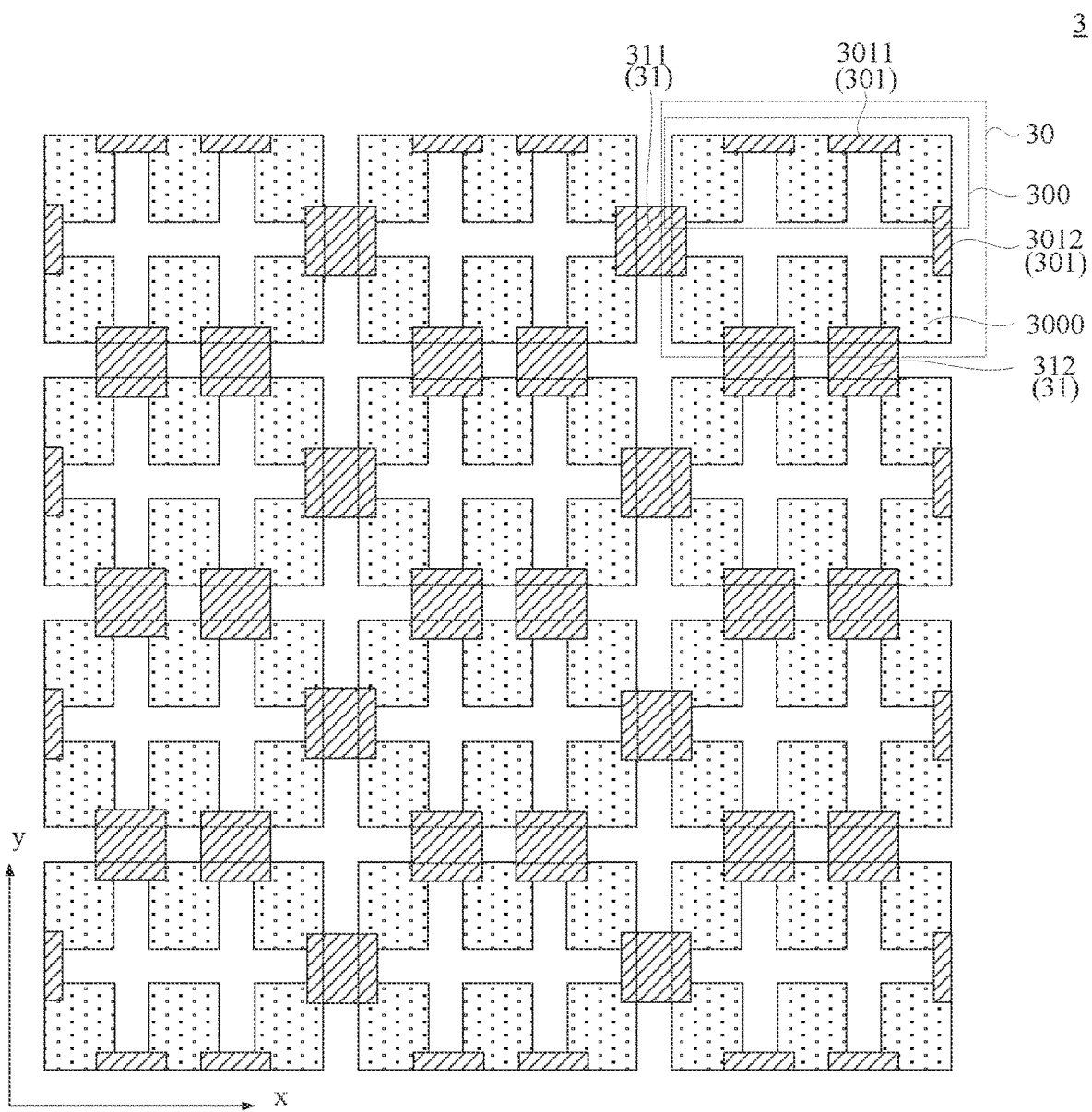
FIG. 9 is an enlarged schematic diagram of a touch electrode in the region Q in FIG. 1, according to an embodiment of the present disclosure.
Figure 10:
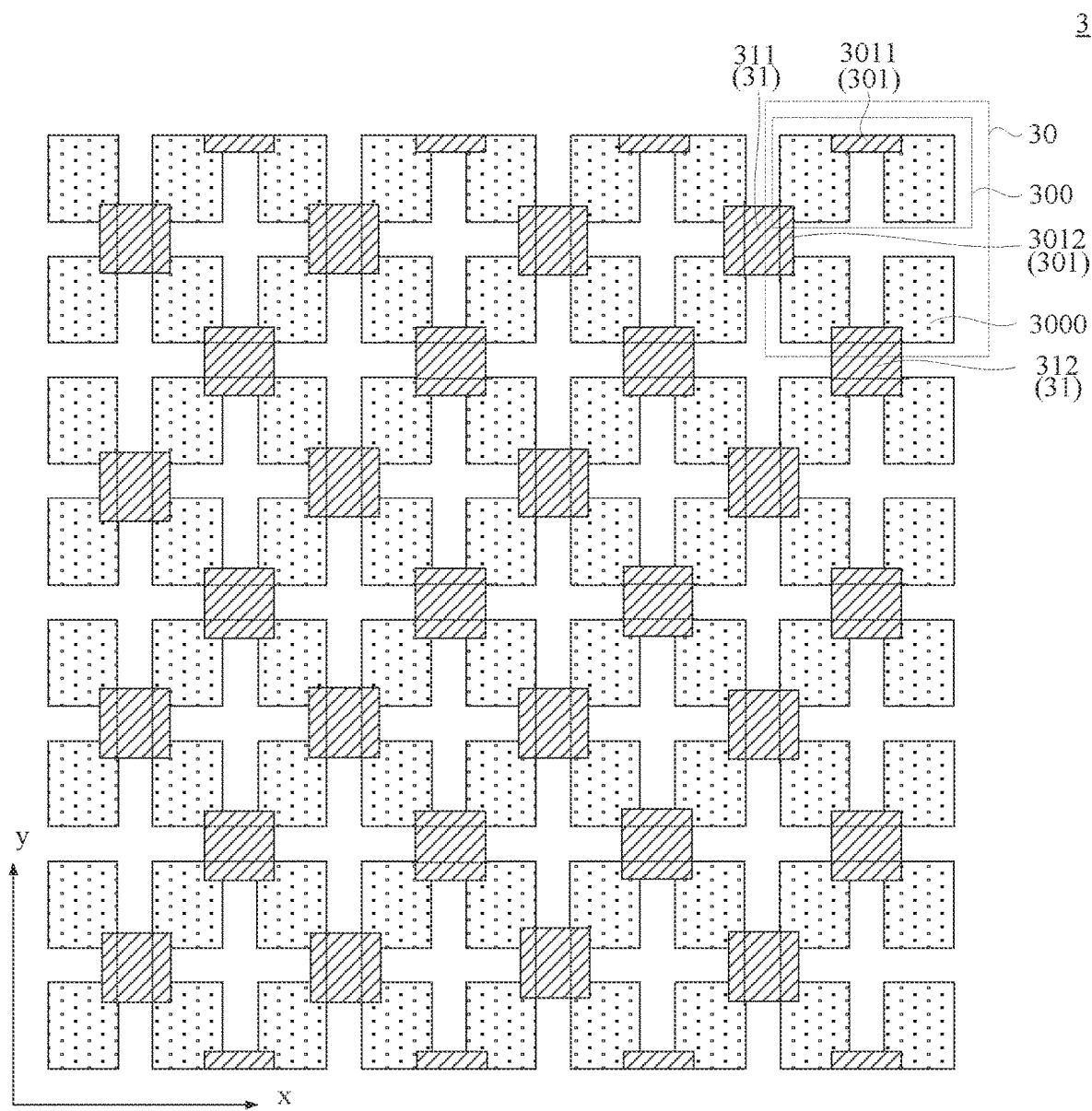
FIG. 10 is an enlarged schematic diagram of a touch electrode in the region Q in FIG. 1, according to an embodiment of the present disclosure.

FIG. 9 and FIG. 10 are two enlarged schematic diagrams of the touch electrode in the region Q in FIG. 1. In FIG. 9 and FIG. 10, two touch sub-electrode rows 300 are provided in one touch sub-electrode group 30. In FIG. 9, three touch sub-electrodes 3000 are provided in one touch sub-electrode row 300. In FIG. 10, two touch sub-electrodes 3000 are provided in one touch sub-electrode row 300. Based on arrangements illustrated in FIGS. 9 and 10, the first inter-group connecting part 311 and the two second intra-group connecting parts 3012 located on both sides of the first inter-group connecting part 311 together form a quadrilateral structure; and the second inter-group connecting part 312 and the two first intra-group connecting parts 3011 located on both sides of the second inter-group connecting part 312 together form a quadrilateral structure.

With the arrangement illustrated in FIG. 10, on the one hand, in the region covered by the touch electrode 3, the connecting parts and the touch sub-electrodes at different positions are distributed relatively uniform, which improves the uniformity of touch at different positions. On the other hand, when the touch electrode 3, the first signal line 1, and the second signal line 2 are stacked, referring to FIG. 2, areas of the connecting parts overlapping different first signal lines 1 tend to be identical, and areas of the connecting parts overlapping different second signal lines 2 also tend to be identical. In this way, different first signal lines 1 or second signal lines 2 are subjected to the substantially same degrees of coupling. When the first signal line 1 is configured to transmit scanning signals for controlling charging of sub-pixels, such an arrangement can improve the uniformity of display. When the second signal line 2 is configured to transmit touch signals, such an arrangement can improve the uniformity of touch.

The above-described embodiments of the present disclosure are examples in which the first inter-group connecting part 311 is configured to connect the two second intra-group connecting parts 3012 respectively belonging to the two touch sub-electrode groups 30, and/or the second inter-group connecting part 312 is configured to connect the two first intra-group connecting parts 3011 respectively belonging to the two touch sub-electrode groups 30. In some other embodiments of the present disclosure, the first inter-group connecting part 311 and/or the second inter-group connecting part 312 can be configured to be directly connected to the touch sub-electrode 3000. For example, at least one of the first inter-group connecting part 311 and the second inter-group connecting part 312 is connected to the point 40 where the first edge 41 and the second edge 42 of the touch sub-electrode 3000 intersect.

Figure 11:
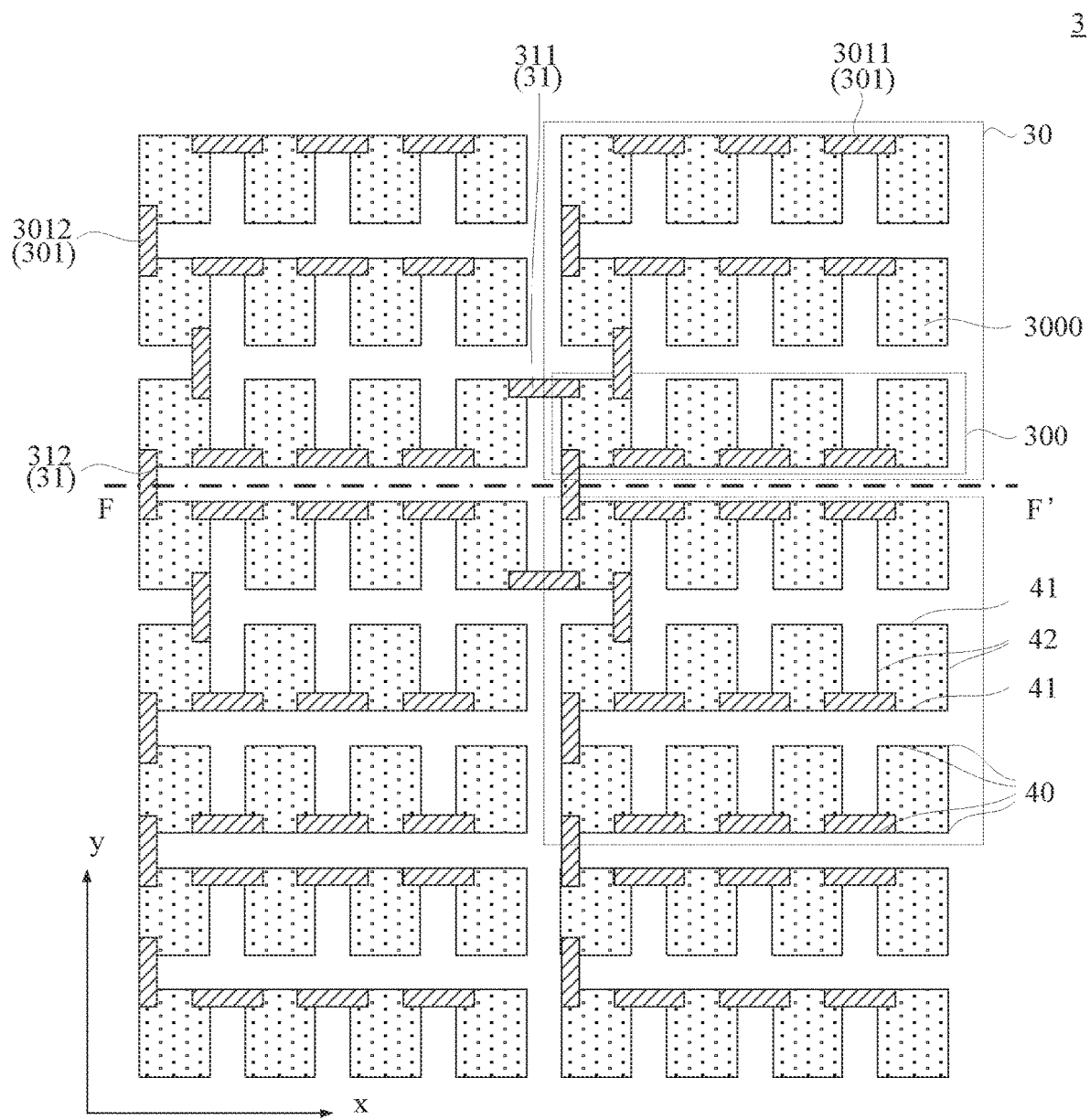
FIG. 11 is an enlarged schematic diagram of a touch electrode in the region Q in FIG. 1, according to an embodiment of the present disclosure.

FIG. 11 is an enlarged schematic diagram of the touch electrode in the region Q in FIG. 1. As illustrated in FIG. 11, E=3, F=4, and nine first intra-group connecting parts 3011 and two second intra-group connecting parts 3012 are provided in one touch sub-electrode 30. The first inter-group connecting part 311 is connected to the point 40 where the first edge 41 and the second edge 42 intersect, and the second inter-group connecting part 312 is connected to another point 40.

As an example, when at least one of the first inter-group connecting part 311 and the second inter-group connecting part 312 is connected to the point 40 where the first edge 41 and the second edge 42 of the touch sub-electrode 3000 intersect, the first inter-group connecting part 311 and at least a part of the first intra-group connecting parts 3011 in the touch sub-electrode group 30 connected to the first inter-group connecting part 311 are arranged in a staggered manner, and the second inter-group connecting part 312 and at least a part of the second intra-group connecting parts 3012 in the touch sub-electrode group 30 connected to the second inter-group connecting part 312 are arranged in a staggered manner.

For example, in the touch sub-electrode group 30 at the upper right corner of FIG. 11, the touch sub-electrode group 30 includes three touch sub-electrode rows 300. In view of FIG. 11, along a direction from the top to the bottom, the third touch sub-electrode row 300 of the touch sub-electrode group 30 is connected to the first inter-group connecting part 311. This first inter-group connecting part 311 is not only arranged in a staggered manner with the first intra-group connecting parts 3011 in the first touch sub-electrode row 300 and the second touch sub-electrode row 300, but also arranged in a staggered manner with the first intra-group connecting parts 3011 in the third touch sub-electrode row 300. In view of FIG. 11, for example, the first intra-group connecting parts 3011 in the third touch sub-electrode row 300 are connected to a lower edge of the third touch sub-electrode row 300, and the first inter-group connecting part 301 is connected to an upper edge of the third touch sub-electrode row 300.

In combination with FIG. 2, along the second direction y, two first signal lines 1 are respectively arranged on two sides of the touch sub-electrode row 300. A degree of coupling between the first signal line 1 and the first intra-group connecting part 3011 or the first inter-group connecting part 301 will increase with a distance between the first signal line 1 and the first intra-group connecting part 3011 or the first inter-group connecting part 301 decreases. If the first intra-group connecting part 3011 and the first inter-group connecting part 301 are aligned, i.e., the first inter-group connecting part 301 connected to the touch sub-electrode group 30 at the upper right corner in FIG. 11 may also be connected to the lower edge of the third touch sub-electrode row 300, a number of connecting parts close to the first signal line 1 arranged close to the lower edge of the third touch sub-electrode row 300 will be significantly larger than a number of the first signal line 1 arranged close to the upper edge of the third touch sub-electrode row 300. That is, a degree of coupling influence on the two first signal lines 1 will be significantly different. With the arrangement according to the present embodiment of the present disclosure, by arranging the first inter-group connecting part 311 and the at least a part of the first intra-group connecting parts 3011 in the touch sub-electrode group 30 connected to the first inter-group connecting part 311 in a staggered manner, different first signal lines 1 are subjected to basically the same the degree of coupling of the connecting parts. For example, when the first signal line 1 is a scan line, it may be ensured that charging time of sub-pixels connected to different scan lines is as consistent as possible.

Similarly, in the present embodiment of the present disclosure, by arranging the second inter-group connecting part 312 and the at least a part of the second intra-group connecting parts 3012 in the touch sub-electrode group 30 connected to the second inter-group connecting part 312 in a staggered manner, different second signal lines 1 are subjected to basically the same the degree of coupling of the connecting parts.

When the first inter-group connecting part 311 and the second inter-group connecting part 312 are directly connected to the touch sub-electrode 3000, it may be set that E=2 and F≤3, that is, the touch sub-electrode group 30 includes two touch sub-electrode rows 300, and each touch sub-electrode row 300 includes at most three touch sub-electrodes 3000, so as to uniformly distribute the touch sub-electrode 3000 and the connecting parts including the first inter-group connecting part 311, the second inter-group connecting part 312, the first intra-group connecting part 3011 and the second intra-group connecting part 3012 in the region where the touch electrode 3 is located, thereby improving the uniformity of touch at different positions.

Figure 12:
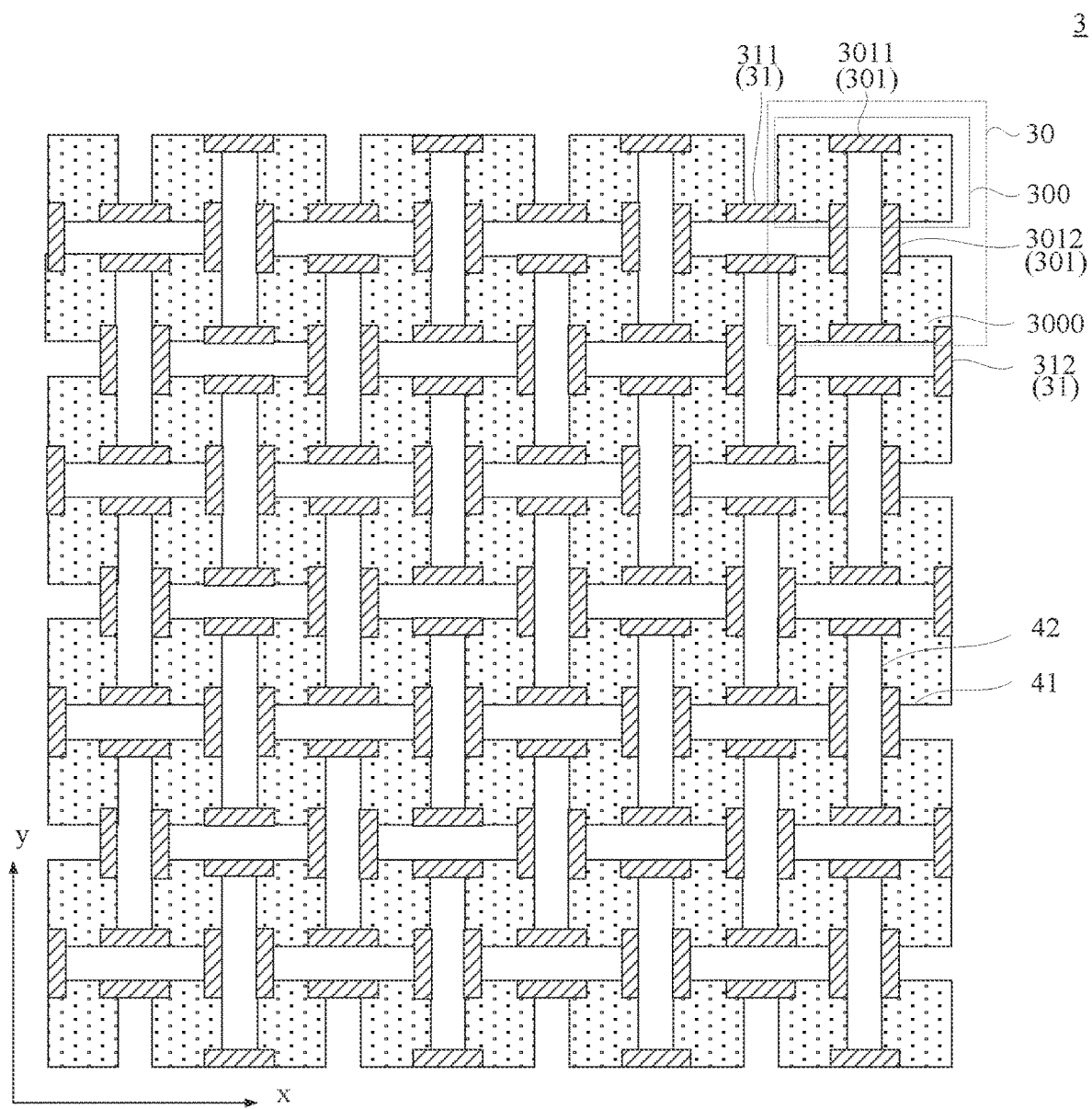
FIG. 12 is an enlarged schematic diagram of a touch electrode in the region Q in FIG. 1, according to an embodiment of the present disclosure.
Figure 13:
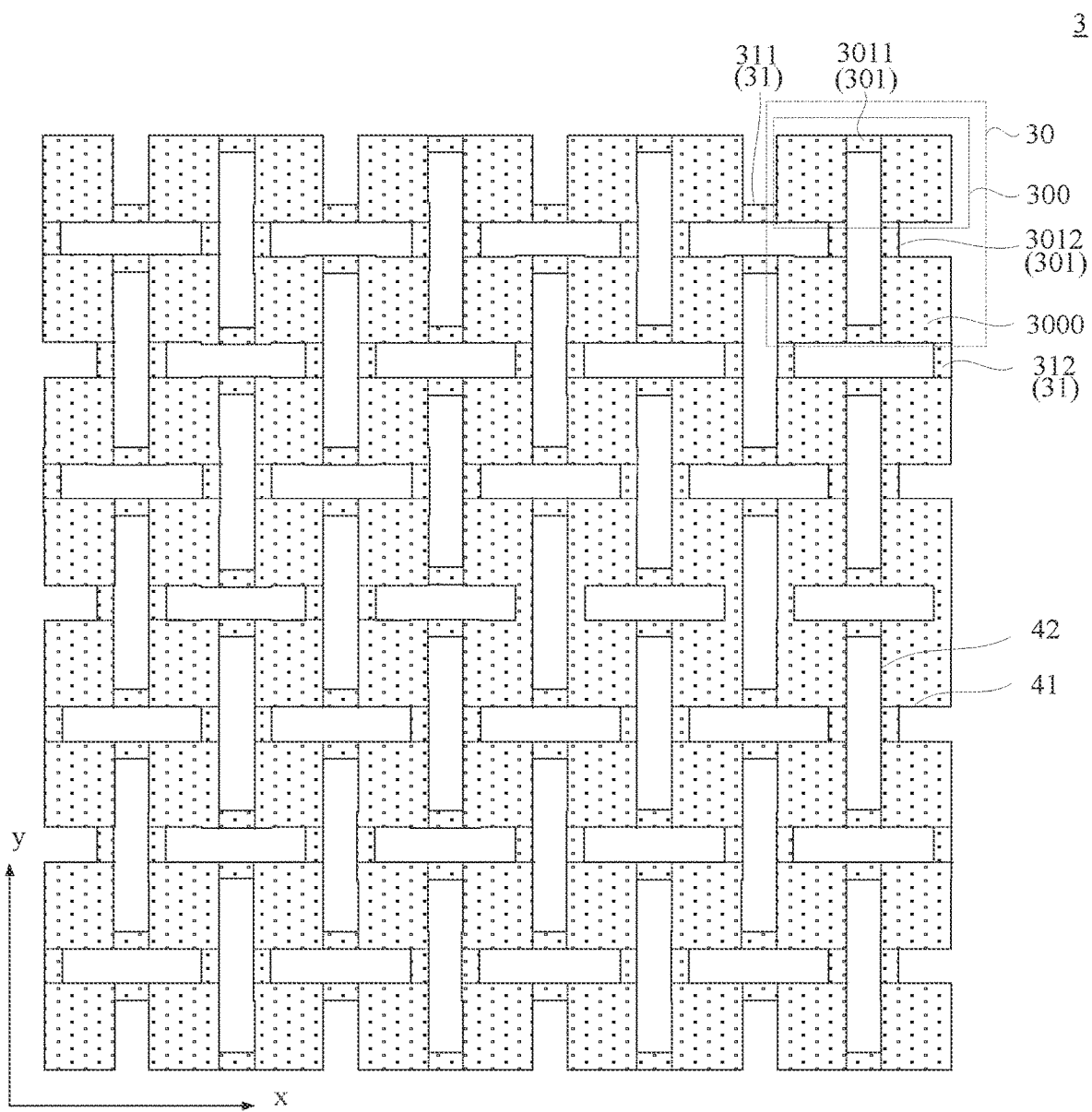
FIG. 13 is an enlarged schematic diagram of a touch electrode in the region Q in FIG. 1, according to an embodiment of the present disclosure.

FIG. 12 and FIG. 13 are two enlarged schematic diagrams of the touch electrode in the region Q in FIG. 1. As illustrated in FIG. 12 and FIG. 13, E=2, and F=2. Thus, a number of connecting parts overlapping with different first signal lines 1 is approximately the same, such that different first signal lines 1 are subjected to basically the same the degree of coupling of the connecting parts. In addition, a number of connecting parts overlapping with different second signal lines 2 is approximately the same, such that different second signal lines 2 are subjected to basically the same the degree of coupling of the connecting parts.

When manufacturing the touch electrode 3 as illustrated in FIG. 13, the connecting parts and the touch sub-electrode 3000 are fabricated in the same layer, a mask plate including two stripe-shaped hollow patterns with different extension directions can be adopted to form a structure as illustrated in FIG. 13, which ensures the uniformity of patterns of the touch electrodes at different positions and also simplifies the manufacturing process.

Figure 14:
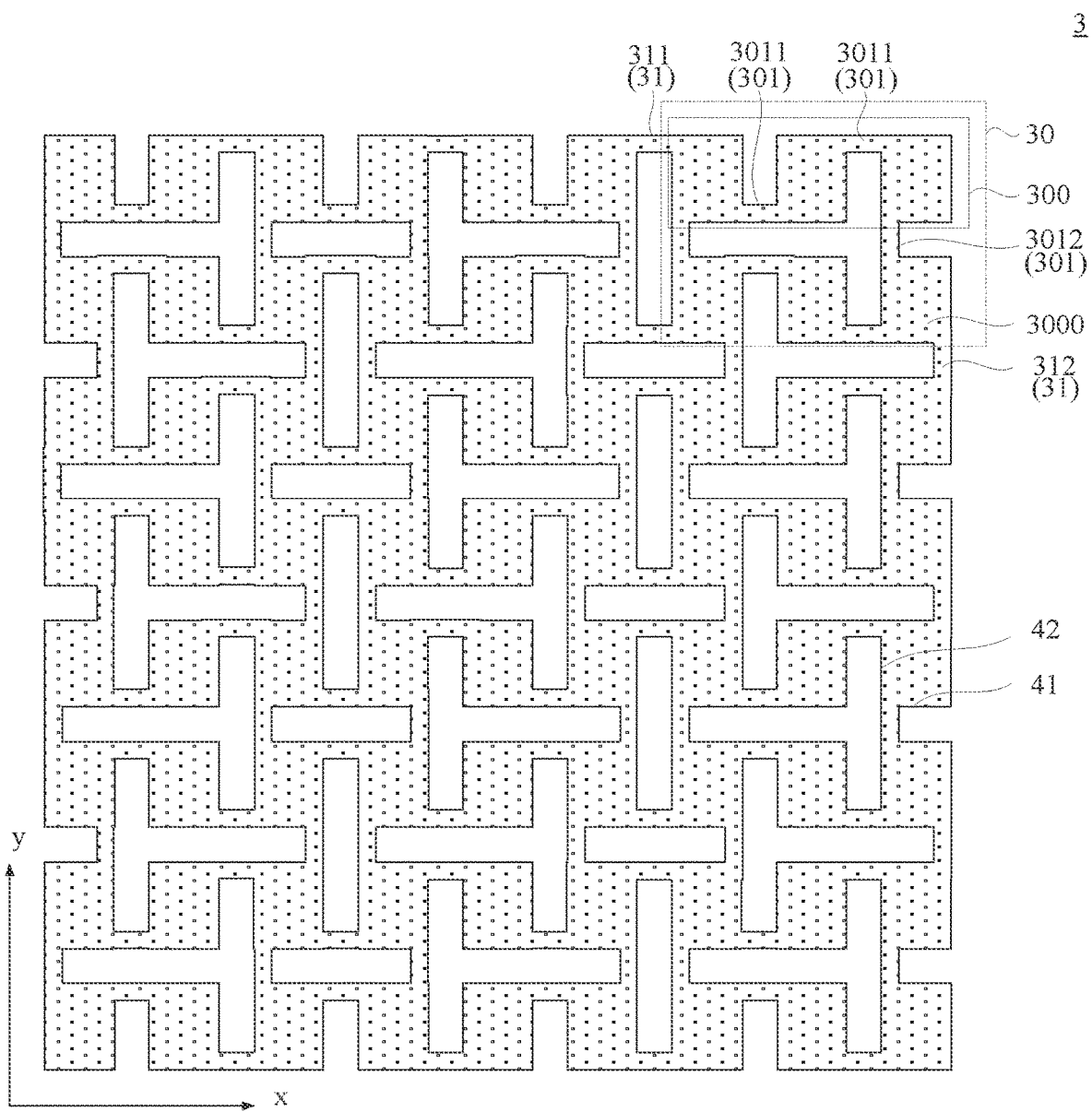
FIG. 14 is an enlarged schematic diagram of a touch electrode in the region Q in FIG. 1, according to an embodiment of the present disclosure.

In another embodiment, as illustrated in FIG. 14, which is an enlarged schematic diagram of the touch electrode in the region Q in FIG. 1, E=2 and F=3. During the fabrication of the touch electrode 3 illustrated in FIG. 14, the connecting parts and the touch sub-electrode 3000 are fabricated in the same layer, the mask plate including the two stripe-shaped hollow patterns with different extension directions and two T-shaped patterns with different orientations may be adopted to form a structure as illustrated in FIG. 14, which ensures the uniformity of patterns of the touch electrodes at different positions and also simplifies the manufacturing process.

As illustrated in FIG. 12, FIG. 13 and FIG. 14, two first inter-group connecting parts 311 are provided between two touch sub-electrode groups 30 adjacent to each other along the first direction x, and the two first inter-group connecting parts 311 are configured to respectively connect the two touch sub-electrode rows 300 in the touch sub-electrode group 30. By providing the two first inter-group connecting parts 311, two conductive channels can be formed between the two touch sub-electrode groups 30 adjacent to each other along the first direction x, thereby reducing the resistance of the touch electrode 3 and improving the sensitivity of touch control of the display panel.

When the second inter-group connecting part 312 is provided, further referring to FIG. 12, FIG. 13 and FIG. 14, two second inter-group connecting parts 312 are provided between two touch sub-electrode groups 30 adjacent to each other along the second direction y, and the two second inter-group connecting parts 312 are configured to respectively connect the two touch sub-electrodes 300 in the touch sub-electrode row 300. By providing the two second inter-group connecting parts 312, two conductive channels can be formed between the two touch sub-electrode groups 30 adjacent to each other along the second direction y, thereby reducing the resistance of the touch electrode 3 and improving the sensitivity of touch control of the display panel.

Figure 15:
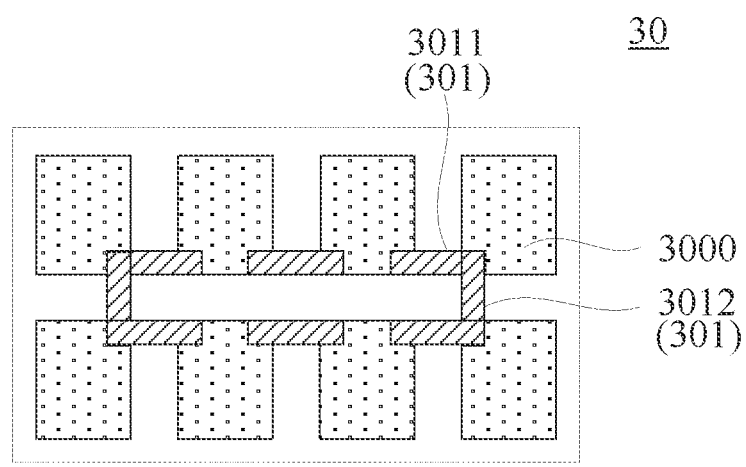
FIG. 15 is a schematic diagram illustrating connecting a first intra-group connecting part and a second intra-group connecting part to same end point of a same edge of a touch sub-electrode, according to an embodiment of the present disclosure.

Referring to FIG. 11, FIG. 12, FIG. 13, and FIG. 14, according to the embodiment of the present disclosure, the first intra-group connecting part 3011 and the second intra-group connecting part 3012, which are connected to the same touch sub-electrode 3000, are respectively connected to two end points of the same edge of the touch sub-electrode 3000. FIG. 15*h* is a schematic diagram illustrating the first intra-group connecting part 3011 and the second intra-group connecting part 3012 that are connected to the same end point of the same edge of the touch sub-electrode 3000. As illustrated in FIG. 15, when the connecting parts and the touch sub-electrode 3000 are made of different material as well as the first intra-group connecting part 3011 and the second intra-group connecting part 3012 are made of metal materials with a relatively small resistivity, if the first intra-group connecting part 3011 and the second intra-group connecting part 3012 are connected to the same end point of the same edge of the touch sub-electrode 3000, during signal transmission, a signal may be directly transmitted to the second intra-group connecting part 3012 via the first intra-group connecting part 3011, bypassing the touch sub-electrode 3000.

Figure 16:
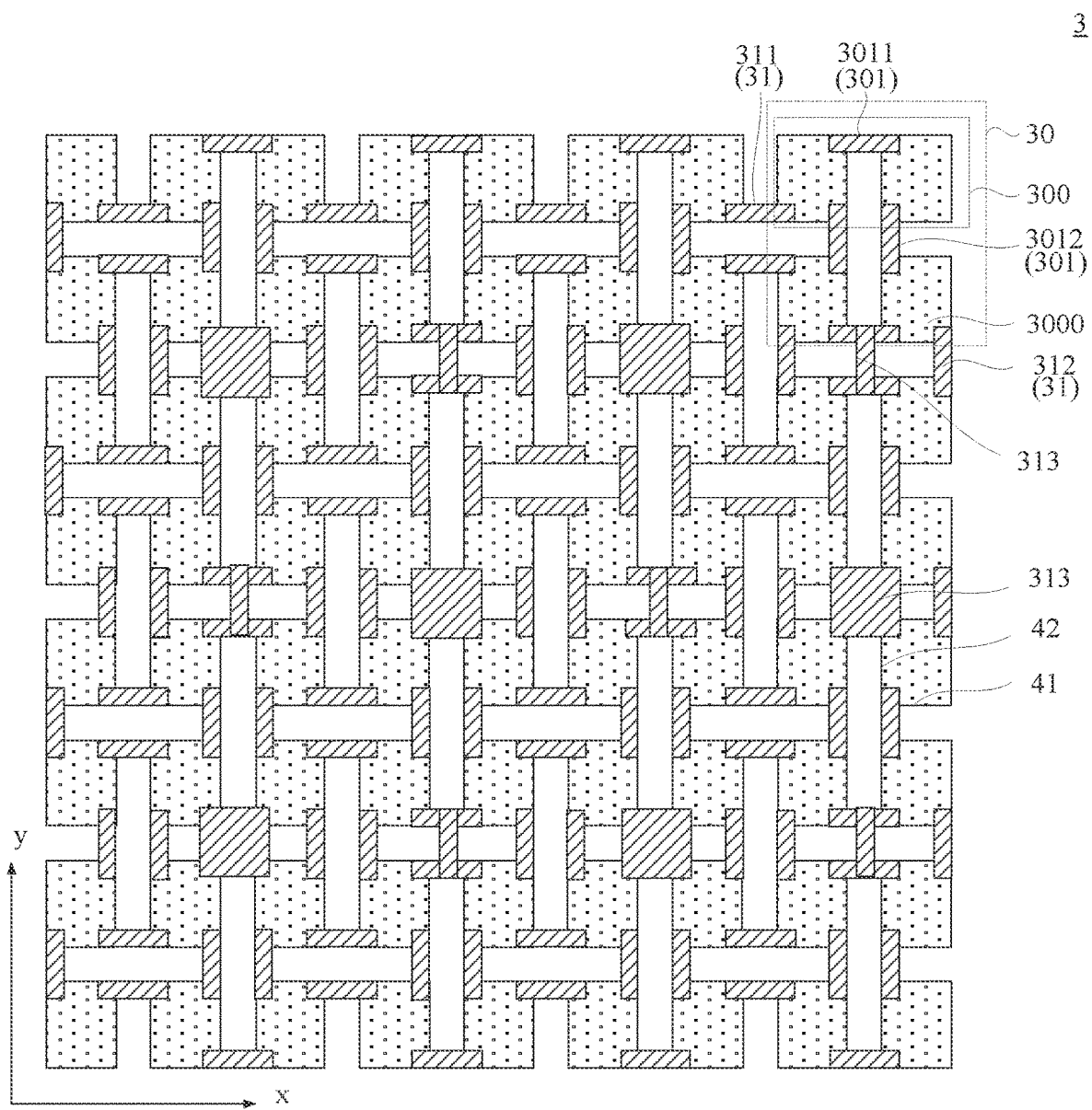
FIG. 16 is an enlarged schematic diagram of a touch electrode in a region Q in FIG. 1, according to an embodiment of the present disclosure.

FIG. 16 is an enlarged schematic diagram of the touch electrode in the region Q in FIG. 1. As illustrated in FIG. 16, the first intra-group connecting part 3011 is arranged along the outermost edge of the touch sub-electrode group 30. The touch electrode 3 further includes a third inter-group connecting part 313. The third inter-group connecting part 313 is configured to connect two touch sub-electrode groups 30 adjacent to each other along the second direction y, and the third inter-group connecting part 31 is connected to two first intra-group connecting parts 3011 in the two touch sub-electrode groups 30 adjacent to each other along the second direction y. By providing the third inter-group connecting part 31, a number of signal transmission channels between the two touch sub-electrode groups 30 can be increased, so as to reduce the resistance of the touch electrode. According to the present embodiment of the present disclosure, an area of the third inter-group connecting part 313 is not specifically limited. As illustrated in FIG. 16, a part of the third inter-group connecting parts 313 may have a relatively small area, so that each of the part of the third inter-group connecting parts 313 and the first intra-group connecting parts 3011 on two sides of each of the part of the third inter-group connecting parts 313 form an "I"-like shape. In other embodiments, the area of the third inter-group connecting part 313 may be designed to be relatively larger, so that the third inter-group connecting part 313 and the first intra-group connecting parts 3011 on two sides of the third inter-group connecting part 313 form a quadrilateral shape.

Figure 17:
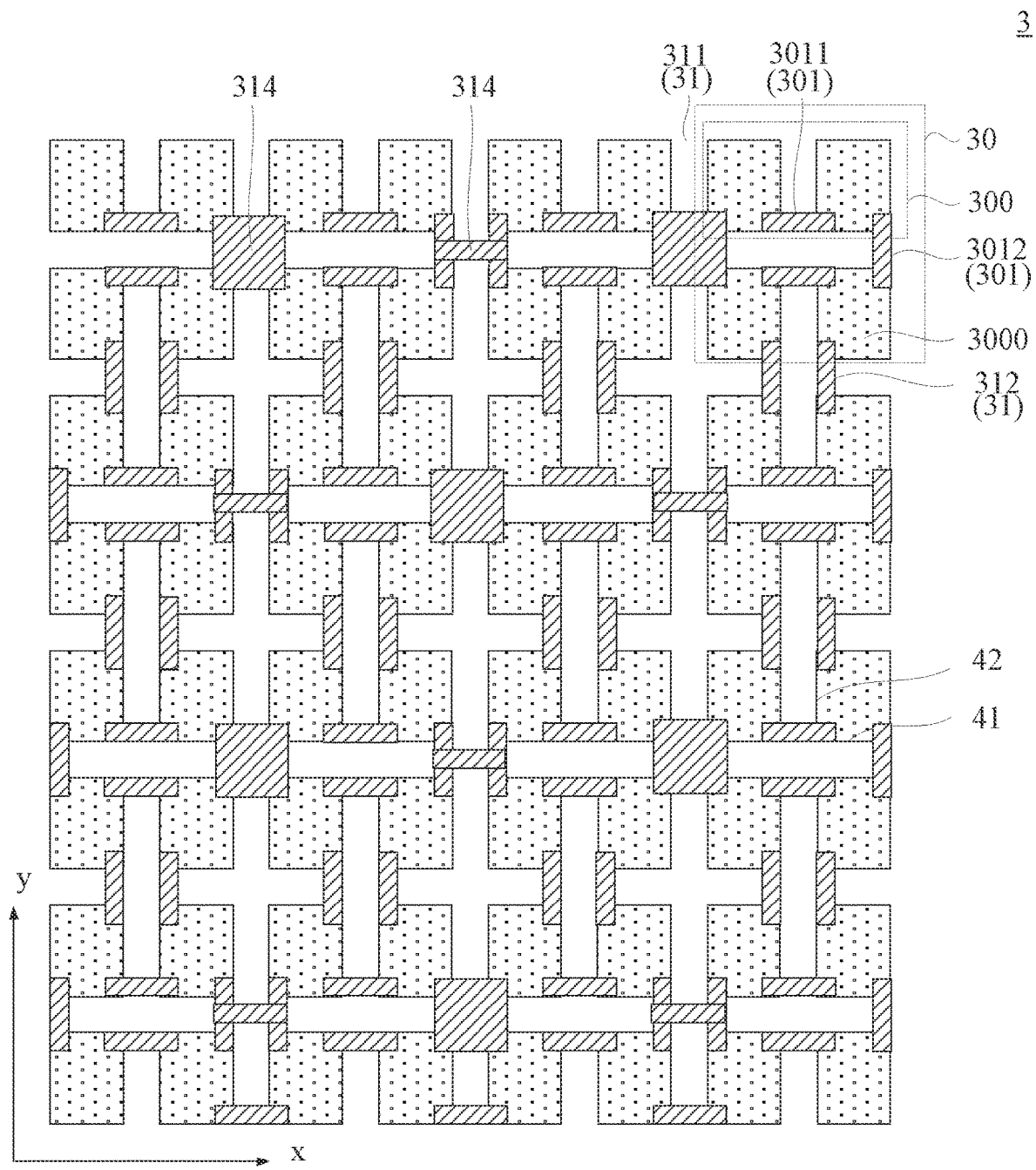
FIG. 17 is an enlarged schematic diagram of a touch electrode in a region Q in FIG. 1, according to an embodiment of the present disclosure.

FIG. 17 is an enlarged schematic diagram of the touch electrode in the region Q illustrated in FIG. 1. For example, as illustrated in FIG. 17, the second intra-group connecting part 3012 is arranged along the outermost edge of the touch sub-electrode group 30, and a fourth inter-group connecting part 314 is additionally provided in the touch electrode 3. The fourth inter-group connecting part 314 is configured to connect two touch sub-electrode groups 30 adjacent to each other along the first direction x, and the fourth inter-group connecting part 31 is connected to two second intra-group connecting parts 3012 in the two touch sub-electrode groups adjacent to each other along the first direction x. By providing the fourth inter-group connecting part 31, a number of signal transmission channels between the two touch sub-electrode groups 30 can be increased, so as to reduce the resistance of the touch electrode. According to embodiments of the present disclosure, an area of the fourth inter-group connecting part 314 is not specifically limited. As illustrated in FIG. 17, a part of the fourth inter-group connecting parts 314 may have a relatively small area, so that each of the part of the fourth inter-group connecting parts 314 and the second intra-group connecting parts 3012 on two sides of each of the part of the fourth inter-group connecting parts 314 form an "H"-like shape. In other embodiment, areas of a part of the fourth inter-group connecting parts 314 may be designed to be relatively larger, so that each of the part of the fourth inter-group connecting parts 3143 and the second intra-group connecting parts 3012 on two sides of each of the part of the fourth inter-group connecting parts 314 form a quadrilateral shape.

Figure 18:
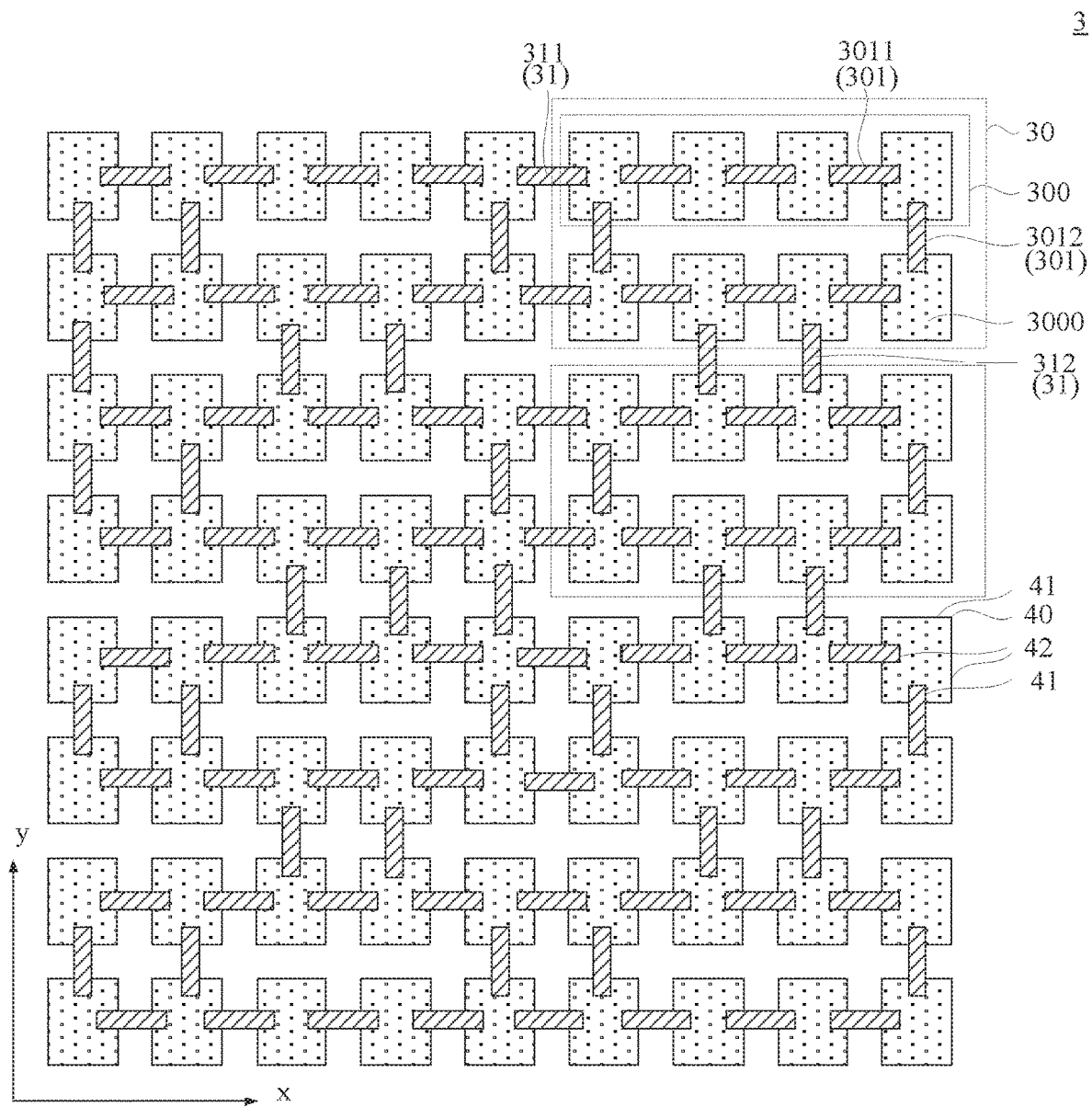
FIG. 18 is an enlarged schematic diagram of a touch electrode in a region Q in FIG. 1, according to an embodiment of the present disclosure.

In some embodiments, at least one of the first intra-group connecting part 3011, the second intra-group connecting part 3012, the first inter-group connecting part 311, and the second inter-group connecting part 312 may be connected to a position other than the point 40 on the first edge 41 or the second edge 42 of the touch sub-electrode 3000. The point 40 is an intersection of the first edge 41 and the second edge 42. FIG. 18 is an enlarged schematic diagram of the touch electrode in the region Q in FIG. 1, illustrating that all of the first intra-group connecting part 3011, the second intra-group connecting part 3012, the first inter-group connecting part 311, and the second inter-group connecting part 312 are connected to other positions on the first edge 41 or the second edge 42 than the point 40. In this way, along the direction perpendicular to the plane of the display panel, the first intra-group connecting part 3011 and the first inter-group connecting part 311 only overlap the second signal line 2 and do not overlap the first signal line 1; and the second intra-group connecting part 3012 and the second inter-group connecting part 312 only overlap the first signal line 1 and do not overlap the second signal line 2. Thus, a touch sub-electrode 3000 located between two first intra-group connecting parts 3011 adjacent to each other can be taken as including two parts connected in parallel. The transmission resistance of the touch signal between the two first intra-group connecting parts 3011 adjacent to each other is relatively small, which is beneficial to increasing a transmission speed of the touch signal and improving the sensitivity of touch of the display panel.

In addition, it should be noted that in the embodiments of the present disclosure, the division of the touch sub-electrode groups is merely for the purpose of better illustrating the pattern structure of the touch electrode provided in the embodiments, and both the touch sub-electrodes and the intra-group connecting parts in different touch sub-electrode groups may be arranged in the same manner. Alternatively, in the embodiments of the present disclosure, the touch sub-electrodes 300 and the intra-group connecting parts 31 in different touch sub-electrode groups 30 may be arranged differently. For example, as illustrated in FIG. 11, along the second direction y, two touch sub-electrode groups 30 adjacent to each other may be symmetrical to each other about a virtual symmetry axis FF' between the two touch sub-electrode groups 30 adjacent to each other.

Figure 19:
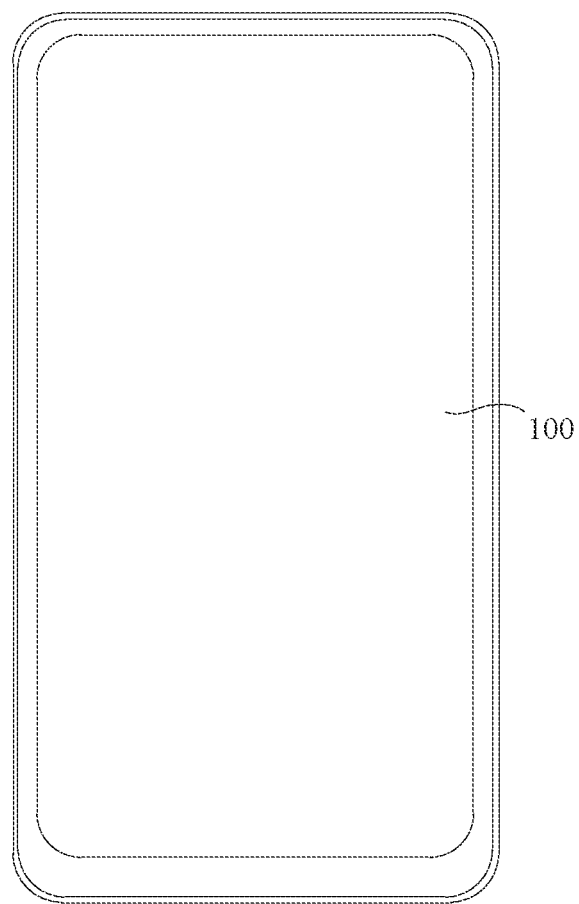
FIG. 19 is a schematic diagram of a display apparatus according to embodiments of the present disclosure.

The embodiments of the present disclosure further provide a display apparatus. FIG. 19 is a schematic diagram of a display apparatus according to an embodiment of the present disclosure. As illustrated in FIG. 19, the display apparatus includes the above-mentioned display panel 100. The specific structure of the display panel 100 has been described in detail in the above-mentioned embodiments, which will not be repeated herein. The display apparatus illustrated in FIG. 19 is only for schematic illustration, and the display apparatus may be any electronic device with a display function, such as a mobile phone, a tablet computer, a notebook computer, an electronic paper book, or a television.

It will be understood that the embodiments of the present disclosure and limitations in the embodiments can be combined with each other without contradiction.

The above are only preferred embodiments of the present disclosure and are not intended to limit the present disclosure. Any modifications, equivalent replacements, improvements, etc., made within the spirit and principle of the present disclosure shall fall within the scope of the present disclosure.

What is claimed is:

1. A display panel, comprising:
   a plurality of first signal lines, wherein each first signal line of the plurality of first signal lines extends along a first direction, the plurality of first signal lines is arranged along a second direction, and the first direction intersecting the second direction;
   a plurality of second signal lines, wherein each second signal line of the plurality of second signal lines extends along the second direction, and the plurality of second signal lines is arranged along the first direction; and
   a plurality of touch electrodes,
   wherein at least two adjacent touch electrodes of the plurality of touch electrodes are electrically connected to corresponding driving control terminals through different second signal lines of the plurality of second signal lines,
   wherein each touch electrode of the plurality of touch electrodes comprises a plurality of touch sub-electrode groups arranged in an array along the first direction and the second direction, and a plurality of inter-group connecting parts, wherein each inter-group connecting part of the plurality of inter-group connecting parts connects two adjacent touch sub-electrode groups of the plurality of touch sub-electrode groups along the first direction or the second direction,
   wherein each touch sub-electrode group of the plurality of touch sub-electrode groups comprises at least two touch sub-electrode rows arranged along the second direction, wherein each touch sub-electrode row of the at least two touch sub-electrode rows comprises at least two touch sub-electrodes arranged along the first direction, and wherein each touch sub-electrode of the at least two touch sub-electrodes comprises a first edge extending along the first direction and a second edge extending along the second direction,
   wherein, along a direction perpendicular to a plane of the display panel, each touch sub-electrode does not overlap the plurality of first signal lines, and does not overlap the plurality of second signal lines that are not electrically connected to the at least two touch sub-electrodes,
   wherein each touch sub-electrode group of the plurality of touch sub-electrode groups further comprises a plurality of intra-group connecting parts, wherein each intra-group connecting part of the plurality of intra-group connecting parts connects two touch sub-electrodes adjacent to each other along the first direction or the second direction, and
   wherein four closest vertices of two adjacent touch sub-electrodes in the first direction and two adjacent touch sub-electrodes in the second direction form a smallest quadrilateral, and the smallest quadrilateral has an area of S0; wherein an orthographic projection of each intra-group connecting part of the plurality of intra-group connecting parts on the plane of the display panel has an area of S1, and wherein the area of S0 and the area of S1 satisfy S1<S0.

2. The display panel according to claim 1, wherein in each of the plurality of touch sub-electrode groups, the plurality of intra-group connecting parts comprises first intra-group connecting parts each configured to connect two touch sub-electrodes adjacent to each other along the first direction, and second intra-group connecting parts each configured to connect two touch sub-electrodes adjacent to each other along the second direction; and
   wherein the plurality of inter-group connecting parts comprises first inter-group connecting parts each configured to connect two touch sub-electrode groups adjacent to each other along the first direction, and second inter-group connecting parts configured to connect two touch sub-electrode groups adjacent to each other along the second direction.

3. The display panel according to claim 2, wherein at least one of the first intra-group connecting parts and the second intra-group connecting parts is connected to a point where the first edge and the second edge of each touch sub-electrode intersect.

4. The display panel according to claim 3, wherein along the direction perpendicular to the plane of the display panel, the first intra-group connecting parts overlap the plurality of second signal lines and do not overlap the plurality of first signal lines; or,
   wherein along the direction perpendicular to the plane of the display panel, the second intra-group connecting parts overlap the plurality of first signal lines and do not overlap the plurality of second signal lines.

5. The display panel according to claim 4, wherein the at least two touch sub-electrode rows of each of the plurality of touch sub-electrode groups comprise two touch sub-electrode rows; and
   wherein the first intra-group connecting parts and the second intra-group connecting parts are arranged along outermost edges of each touch sub-electrode group of the plurality of touch sub-electrode groups.

6. The display panel according to claim 5, wherein each of the first inter-group connecting parts connects two adjacent second intra-group connecting parts respectively belonging to two adjacent touch sub-electrode groups of the plurality of touch sub-electrode groups; or,
   wherein each of the second inter-group connecting parts connects two adjacent first intra-group connecting parts respectively belonging to the two adjacent touch sub-electrode groups of the plurality of touch sub-electrode groups.

7. The display panel according to claim 4, wherein the first inter-group connecting part and at least a portion of the first intra-group connecting parts in the two touch sub-electrode groups connected to the first inter-group connecting part are arranged in a staggered manner; and
   wherein the second inter-group connecting part and at least a part of the second intra-group connecting parts in the two touch sub-electrode groups connected to the second inter-group connecting part are arranged in a staggered manner.

8. The display panel according to claim 4, wherein the first intra-group connecting part and the second intra-group connecting part that are connected to a same touch sub-electrode are respectively connected to two end points located on a same edge of the same touch sub-electrode.

9. The display panel according to claim 8, wherein at least one of the first inter-group connecting part and the second inter-group connecting part is connected to a point where the first edge and the second edge of each touch sub-electrode intersect.

10. The display panel according to claim 8, wherein the at least two touch sub-electrode rows of each touch sub-electrode group of the plurality of touch sub-electrode groups comprise two touch sub-electrode rows; and wherein two of the first inter-group connecting parts are arranged between two touch sub-electrode groups adjacent to each other along the first direction, and are connected to the two touch sub-electrode rows in each touch sub-electrode group of the plurality of touch sub-electrode groups, respectively.

11. The display panel according to claim 10, wherein the at least two touch sub-electrodes arranged along the first direction in each of the two touch sub-electrode rows comprise two touch sub-electrodes; and wherein two of the second inter-group connecting parts are arranged between two touch sub-electrode groups adjacent to each other along the second direction, and are connected to the two touch sub-electrodes in each of the two touch sub-electrode rows, respectively.

12. The display panel according to claim 11, wherein the first intra-group connecting parts are arranged along an outermost edge of each of the plurality of touch sub-electrode groups; and wherein each touch electrode of the plurality of touch electrodes further comprises third inter-group connecting parts each configured to connect two touch sub-electrode groups adjacent to each other along the second direction and to connect to two first intra-group connecting parts in the two touch sub-electrode groups adjacent to each other along the second direction; or wherein the second intra-group connecting parts are arranged along an outermost edge of each touch sub-electrode group of the plurality of touch sub-electrode groups; and wherein each touch electrode of the plurality of touch electrodes further comprises fourth inter-group connecting parts each configured to connect two touch sub-electrode groups adjacent to each other along the first direction and to connect to two second intra-group connecting parts in the two touch sub-electrode groups adjacent to each other along the first direction.

13. The display panel according to claim 1, wherein the touch sub-electrodes are made in a same layer as at least one of each intra-group connecting part of the plurality of intra-group connecting parts and each inter-group connecting part of the plurality of inter-group connecting parts.

14. The display panel according to claim 1, wherein the touch sub-electrodes are made in a different layer from at least one of each intra-group connecting part of the plurality of intra-group connecting parts and each inter-group connecting part of the plurality of inter-group connecting parts.

15. A display apparatus, comprising a display panel, the display panel comprising:

a plurality of first signal lines, wherein each first signal line of the plurality of first signal lines extends along a first direction, wherein the plurality of first signal lines is arranged along a second direction, and wherein the first direction intersects the second direction;

a plurality of second signal lines, wherein each second signal line of the plurality of second signal lines extends along the second direction, and wherein the plurality of second signal lines is arranged along the first direction; and a plurality of touch electrodes, wherein at least two adjacent touch electrodes of the plurality of touch electrodes are electrically connected to corresponding driving control terminals through different second signal lines of the plurality of second signal lines, wherein each touch electrode of the plurality of touch electrodes comprises a plurality of touch sub-electrode groups arranged in an array along the first direction and the second direction, and a plurality of inter-group connecting parts, wherein each inter-group connecting part of the plurality of inter-group connecting parts connects two adjacent touch sub-electrode groups of the plurality of touch sub-electrode groups along the first direction or the second direction, wherein each touch sub-electrode group of the plurality of touch sub-electrode groups comprises at least two touch sub-electrode rows arranged along the second direction, wherein each of the at least two touch sub-electrode rows comprises at least two touch sub-electrodes arranged along the first direction, and wherein each of the at least two touch sub-electrodes comprises a first edge extending along the first direction, and a second edge extending along the second direction, wherein, along a direction perpendicular to a plane of the display panel, each touch sub-electrode does not overlap the plurality of first signal lines, and does not overlap the plurality of second signal lines that are not electrically connected to the at least two touch sub-electrodes, wherein each touch sub-electrode group of the plurality of touch sub-electrode groups further comprises a plurality of intra-group connecting parts, wherein each intra-group connecting part of the plurality of intra-group connecting parts connects two touch sub-electrodes adjacent to each other along the first direction or the second direction, and wherein four closest vertices of two adjacent touch sub-electrodes in the first direction and two adjacent touch sub-electrodes in the second direction form a smallest quadrilateral, wherein the smallest quadrilateral has an area of S0; and wherein an orthographic projection of each intra-group connecting part of the plurality of intra-group connecting parts on the plane of the display panel has an area of S1, the area of S0 and the area of S1 satisfying S1<S0.

* * * * *